(12) United States Patent
Jeoung et al.

(10) Patent No.: US 12,549,879 B2
(45) Date of Patent: Feb. 10, 2026

(54) DISPLAY APPARATUS

(71) Applicant: LG Display Co., Ltd., Seoul (KR)

(72) Inventors: Doyoung Jeoung, Paju-si (KR); GeonJung Park, Paju-si (KR); YunHo Hwang, Paju-si (KR); HyeonKu Jeon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 265 days.

(21) Appl. No.: 18/372,090

(22) Filed: Sep. 23, 2023

(65) Prior Publication Data

US 2024/0015428 A1    Jan. 11, 2024

Related U.S. Application Data

(63) Continuation of application No. 17/507,155, filed on Oct. 21, 2021, now Pat. No. 11,812,210.

(30) Foreign Application Priority Data

Oct. 23, 2020  (KR) .................. 10-2020-0138041

(51) Int. Cl.
*H04R 1/02*    (2006.01)
*G02F 1/1345*    (2006.01)

(52) U.S. Cl.
CPC ......... *H04R 1/028* (2013.01); *G02F 1/13452* (2013.01); *H04R 2499/15* (2013.01)

(58) Field of Classification Search
CPC .. H04R 1/028; H04R 2499/15; G02F 1/13452
See application file for complete search history.

(56) References Cited

U.S. PATENT DOCUMENTS

| | | | |
|---|---|---|---|
| 11,812,210 B2* | 11/2023 | Jeoung | G02F 1/13452 |
| 2015/0316810 A1 | 11/2015 | Shibahara | |
| 2015/0373441 A1 | 12/2015 | Behles et al. | |
| 2018/0317000 A1 | 11/2018 | Ham et al. | |
| 2019/0037164 A1 | 1/2019 | Kim et al. | |
| 2019/0182573 A1 | 6/2019 | Shin et al. | |
| 2020/0100022 A1 | 3/2020 | Shin et al. | |
| 2020/0213699 A1 | 7/2020 | You et al. | |

(Continued)

FOREIGN PATENT DOCUMENTS

| | | |
|---|---|---|
| CN | 101750768 A | 6/2010 |
| CN | 104919816 A | 9/2015 |

(Continued)

OTHER PUBLICATIONS

Office Action issued Nov. 20, 2023 in corresponding Chinese Patent Application No. 202111232400.1.

*Primary Examiner* — Andrew Sniezek
(74) *Attorney, Agent, or Firm* — Morgan, Lewis & Bockius LLP

(57) ABSTRACT

A display apparatus includes a display device including a display panel configured to display an image and a driving circuit part including a printed circuit board connected to the display panel, a first cover disposed at a rear surface of the display device, a first coupling member disposed between the first cover and the printed circuit board, and a vibration apparatus disposed at the rear surface of the display device and configured to vibrate the display device. The printed circuit board is disposed at one periphery of a rear surface of the first cover.

32 Claims, 9 Drawing Sheets

(56) References Cited

U.S. PATENT DOCUMENTS

| | | |
|---|---|---|
| 2020/0245071 A1 | 7/2020 | Won et al. |
| 2020/0280807 A1 | 9/2020 | Kim |
| 2021/0014449 A1 | 1/2021 | Maeshiba et al. |
| 2021/0092528 A1 | 3/2021 | Lee et al. |
| 2021/0105550 A1 | 4/2021 | You et al. |

FOREIGN PATENT DOCUMENTS

| | | |
|---|---|---|
| CN | 109922412 A | 6/2019 |
| CN | 111383563 A | 7/2020 |
| KR | 10-2016-0039060 A | 4/2016 |
| KR | 10-2017-0050512 A | 5/2017 |
| KR | 10-2019-0018784 A | 2/2019 |
| KR | 10-2020-0083118 A | 7/2020 |
| WO | 2014/002779 A1 | 1/2014 |
| WO | 2019/131041 A1 | 7/2019 |

\* cited by examiner

DISPLAY APPARATUS

CROSS-REFERENCE TO RELATED APPLICATIONS

This application is a continuation of co-pending U.S. patent application Ser. No. 17/507,155, filed on Oct. 21, 2021, which claims the benefit of and priority to Korean Patent Application No. 10-2020-0138041, filed on Oct. 23, 2020. The entirety of each of the above prior U.S. and Korean patent applications is hereby incorporated by reference.

BACKGROUND

Technical Field

The present disclosure relates to a display apparatus.

Discussion of the Related Art

Display apparatuses are equipped in home appliances and electronic apparatuses, such as televisions (TVs), monitors, notebook computers, smartphones, tablet computers, electronic pads, wearable apparatuses, watch phones, portable information apparatuses, navigation apparatuses, and automotive control display apparatuses, and are used as a screen for displaying an image.

Display apparatuses may include a display panel for displaying an image and a sound device for outputting a sound associated with the image. However, in general display apparatuses, because a sound output from a sound device may travel to a rearward or a downward direction of the display apparatus, sound quality may be degraded due to interference between sounds reflected from a wall and the ground (or floor). For this reason, it may be difficult to transfer an accurate sound, and an immersion experience of a viewer is reduced.

SUMMARY

The inventors have recognized problems of general display apparatuses and have performed various experiments so that, when a user in front of a display panel is watching an image, a traveling direction of sound is toward a front surface of the display panel. Thus, sound quality may be enhanced. Thus, through the various experiments, the inventors have invented a display apparatus having a new structure that may generate sound traveling to a forward region in front of the display panel, thereby enhancing sound quality. Accordingly, embodiments of the present disclosure are directed to a display apparatus that substantially obviate one or more problems due to limitations and disadvantages of the related art.

An aspect of the present disclosure is to provide a display apparatus which output sound to a forward region in front of a display panel.

Another aspect of the present disclosure is to provide a display apparatus which improve sound quality and increase an immersion experience of a viewer (or a user) or listener.

Another aspect of the present disclosure is to provide a display apparatus which remove unnecessary friction noise generated in the display apparatus by a vibration of a vibration apparatus.

Another aspect of the present disclosure is to provide a display apparatus for preventing or minimizing damage to a driving circuit caused by a vibration of a vibration apparatus.

Additional features and aspects will be set forth in the description that follows, and in part will become apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display apparatus comprises a display device including a display panel configured to display an image and a driving circuit part including a printed circuit board connected to the display panel, a first cover disposed at a rear surface of the display device, a first coupling member disposed between the first cover and the printed circuit board, and a vibration apparatus disposed at the rear surface of the display device and configured to vibrate the display device, the printed circuit board is disposed at one periphery of a rear surface of the first cover.

The display apparatus according to an embodiment of the present disclosure may output a sound in a forward direction of the display panel and may output a sound having improved sound quality, sound performance, and sound pressure level characteristic, thereby increasing the immersion experience of a viewer (or a user) or a listener.

Moreover, the display apparatus according to the embodiments of the present disclosure may remove an undesired frictional sound occurring when the vibration apparatus is vibrating, and thus, may improve sound quality, thereby increasing the immersion experience of a viewer (or a user) or a listener.

In addition, the display apparatus according to the embodiments of the present disclosure may prevent or minimize the damage of the driving circuit part caused by a vibration of the vibration apparatus, thereby enhancing the reliability of the driving circuit part.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

Figure 1:
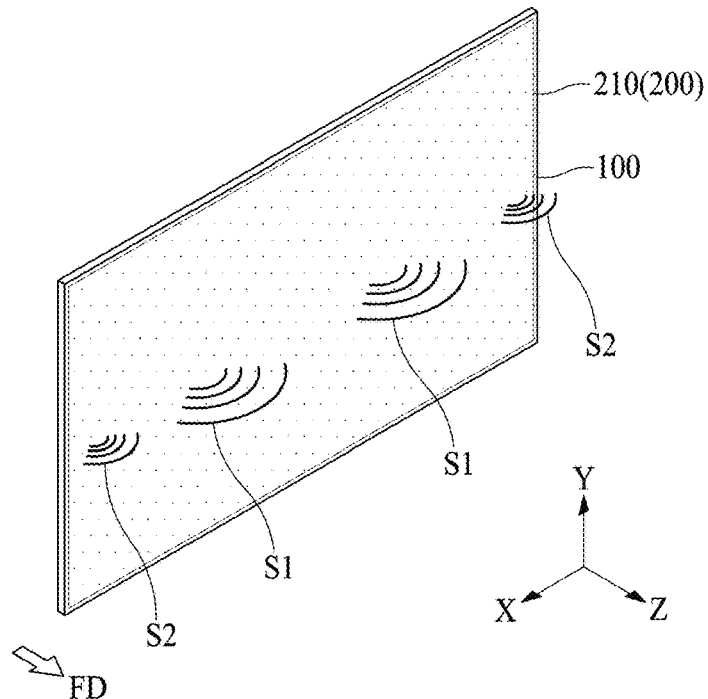
FIG. 1 illustrates a display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Advantages and features of the present disclosure, and implementation methods thereof will be clarified through the following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, embodiments of the present disclosure are not limited to the illustrated details. Like reference numerals refer to like elements throughout. In the following description, when the detailed description of the relevant known technology is determined to unnecessarily obscure the important point of the present disclosure, the detailed description will be omitted.

When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of a display apparatus according to the present disclosure will be described in detail with reference to the accompanying drawings. In adding reference numerals to elements of each of the drawings, although the same elements are illustrated in other drawings, like reference numerals may refer to like elements. In the following description, when the detailed description of the relevant known function or configuration is determined to unnecessarily obscure the present disclosure, the detailed description may be omitted. Also, for convenience of description, a scale of each of elements illustrated in the accompanying drawings differs from a real scale, and thus, is not limited to a scale illustrated in the drawings.

FIG. 1 illustrates a display apparatus according to an embodiment of the present disclosure.

With reference to FIG. 1, the display apparatus according to an embodiment of the present disclosure may output a sound S1 and S2 (or a display vibration sound DVS1 and DVS2) based on a vibration of a display device 200 configured to display an image. For example, in the display apparatus, the display device 200 may vibrate by a vibration apparatus (or a vibration generating apparatus) to generate sounds S1 and S2. Therefore, the display apparatus according to an embodiment of the present disclosure may output the sound S1 and S2 to a forward direction FD of a screen using the display device 200 as a vibration plate, thereby transferring an accurate sound, improving sound quality, and increasing an immersion experience of a viewer or a user.

Figure 2:
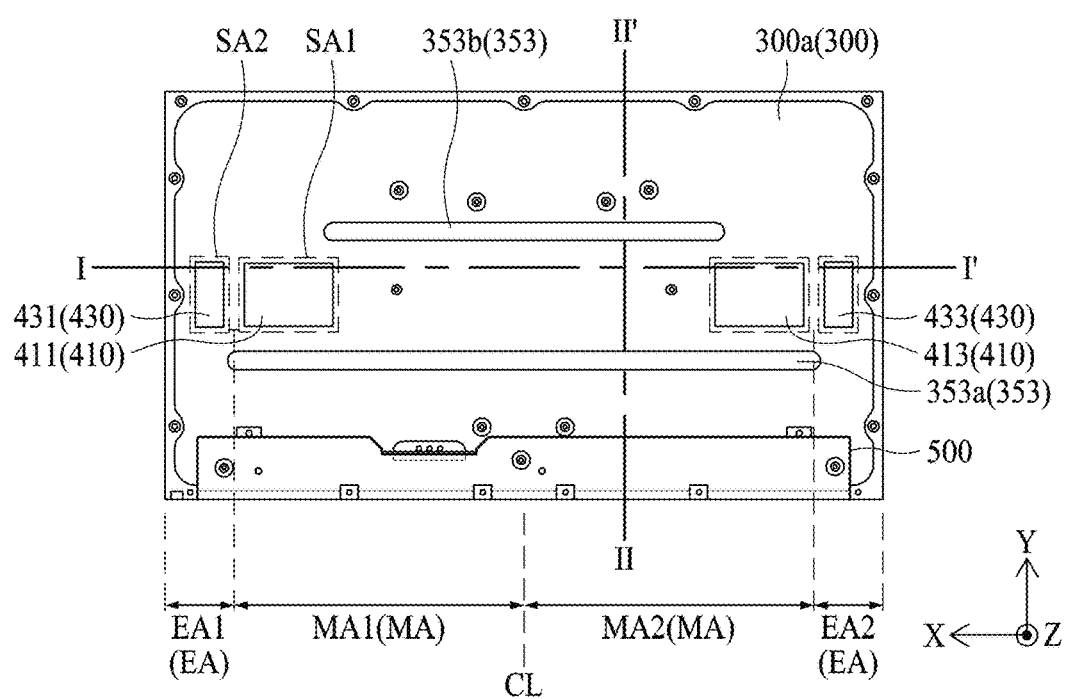
FIG. 2 illustrates a second cover and a vibration apparatus disposed at a first cover of the display apparatus illustrated in FIG. 1.
Figure 3:
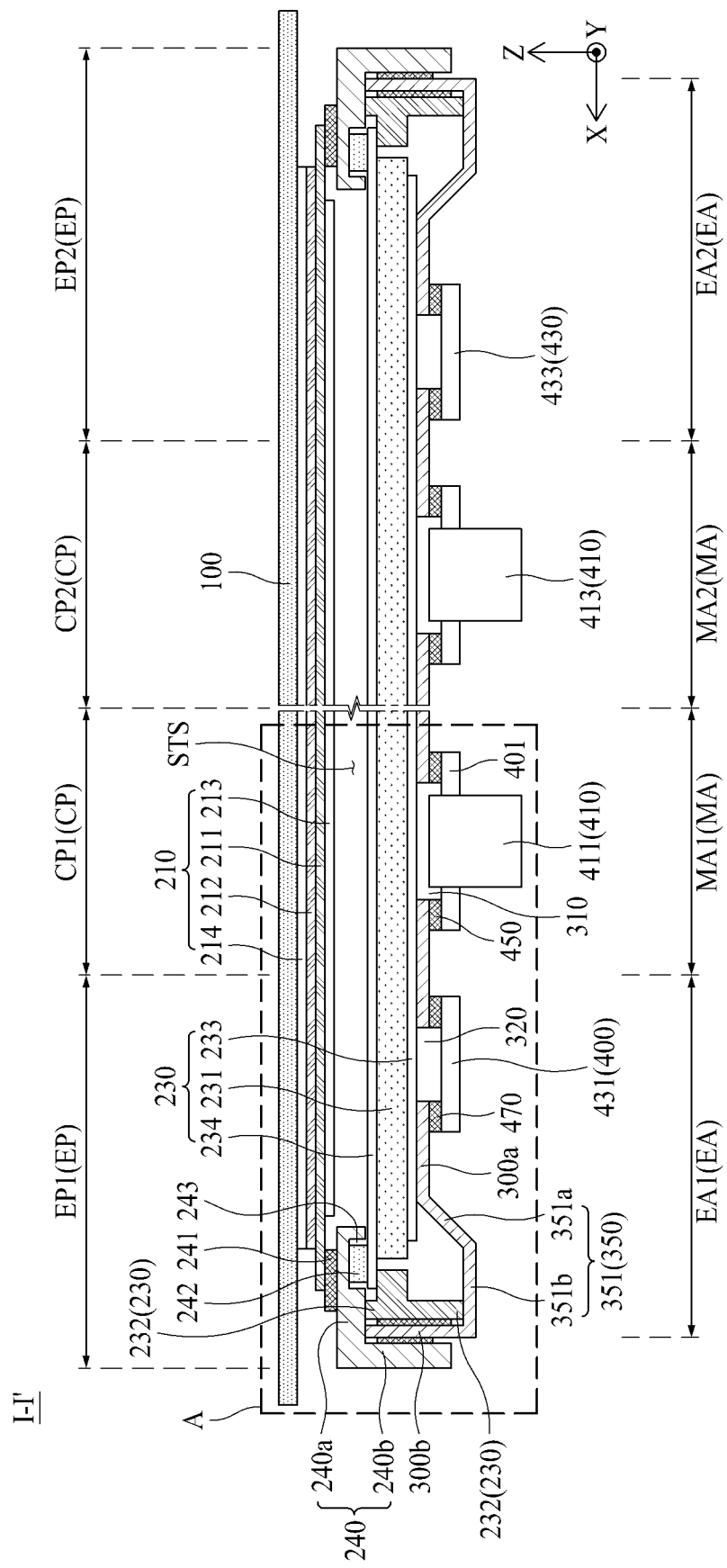
FIG. 3 is a cross-sectional view taken along line I-I' illustrated in FIG. 2.
Figure 4:
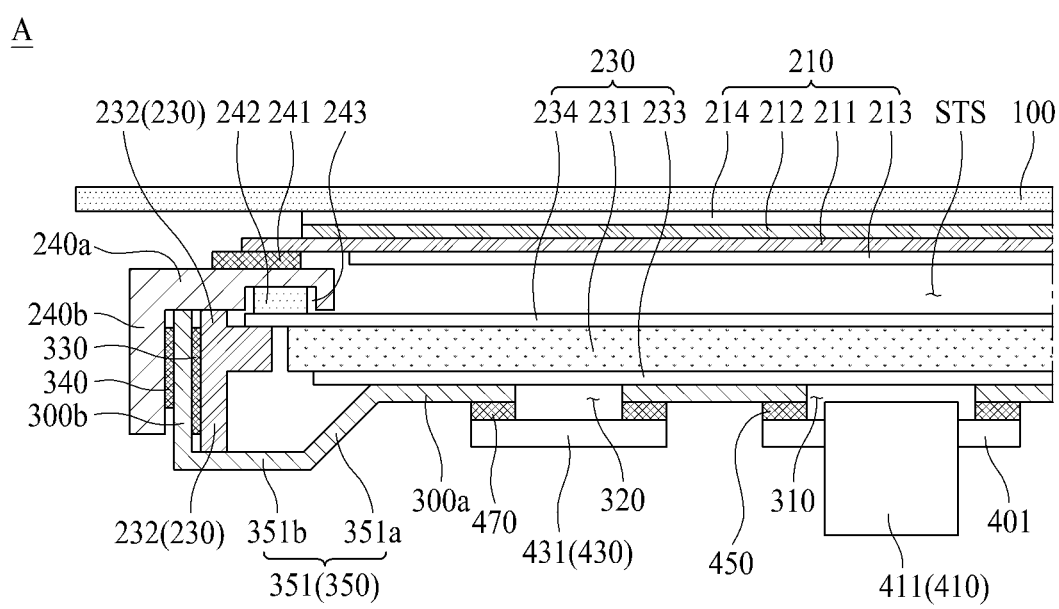
FIG. 4 is an enlarged view of a region 'A' illustrated in FIG. 3.
Figure 5:
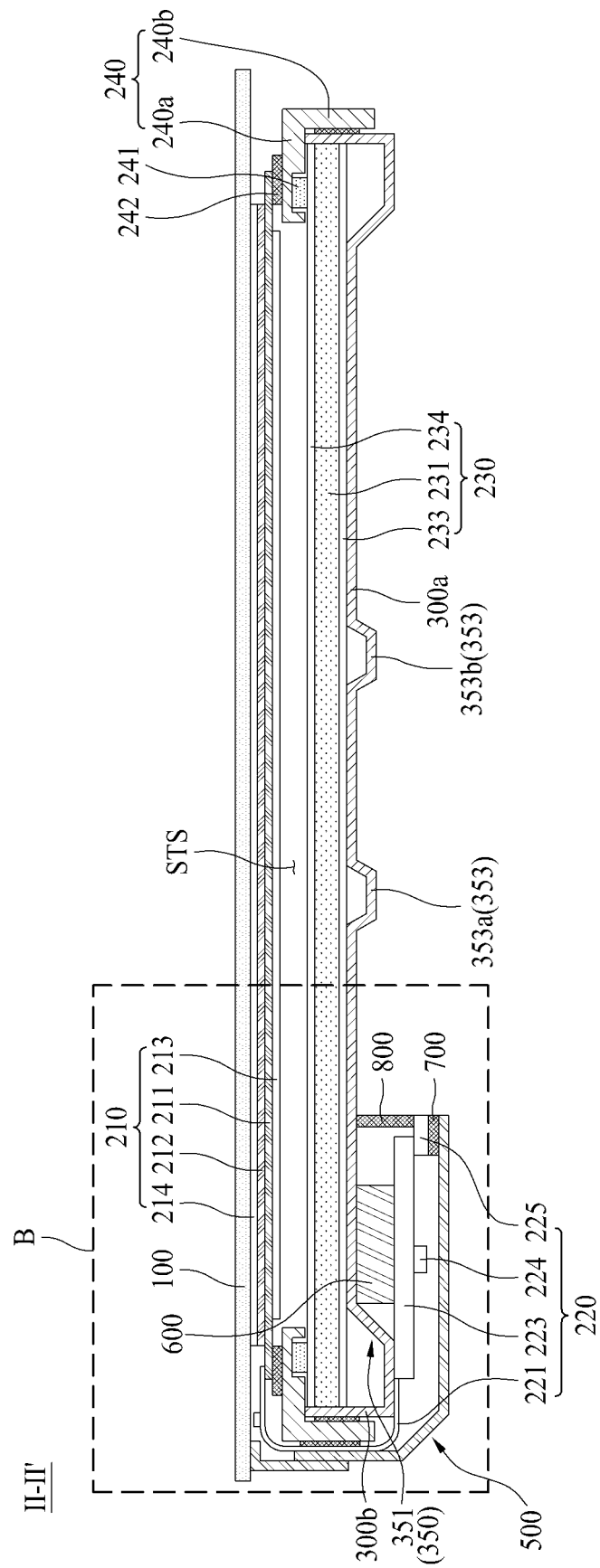
FIG. 5 is a cross-sectional view taken along line II-II' illustrated in FIG. 2.
Figure 6:
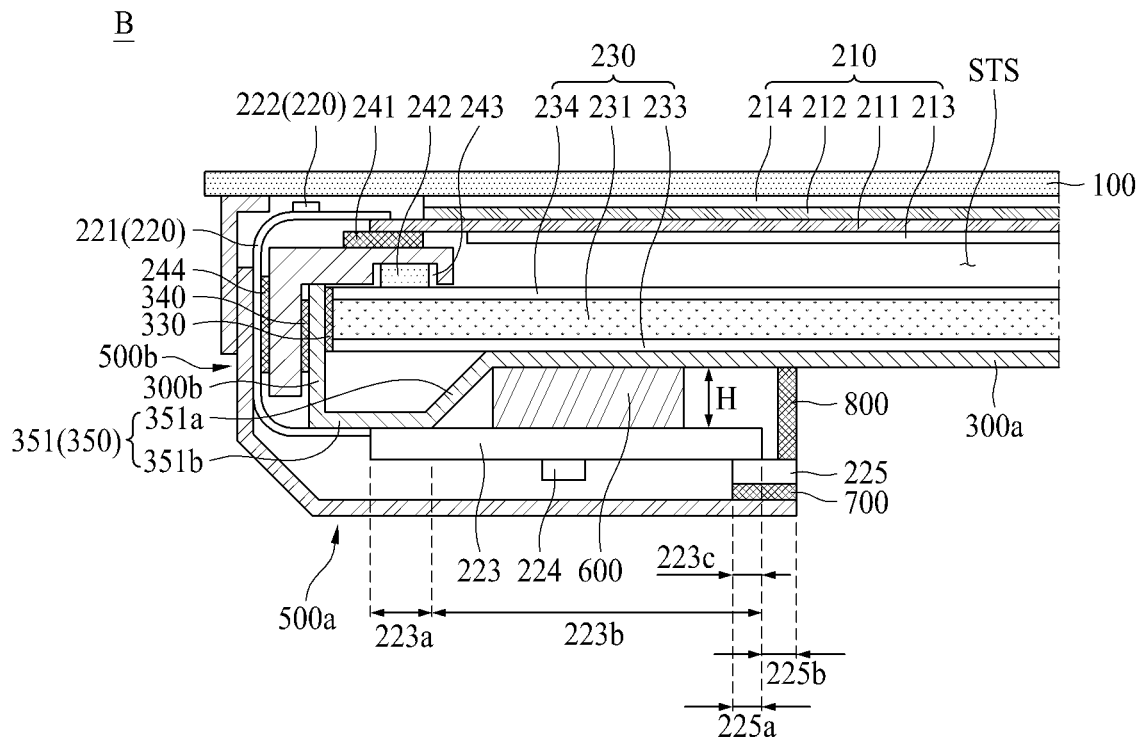
FIG. 6 is an enlarged view of a region 'B' illustrated in FIG. 5.
Figure 7:
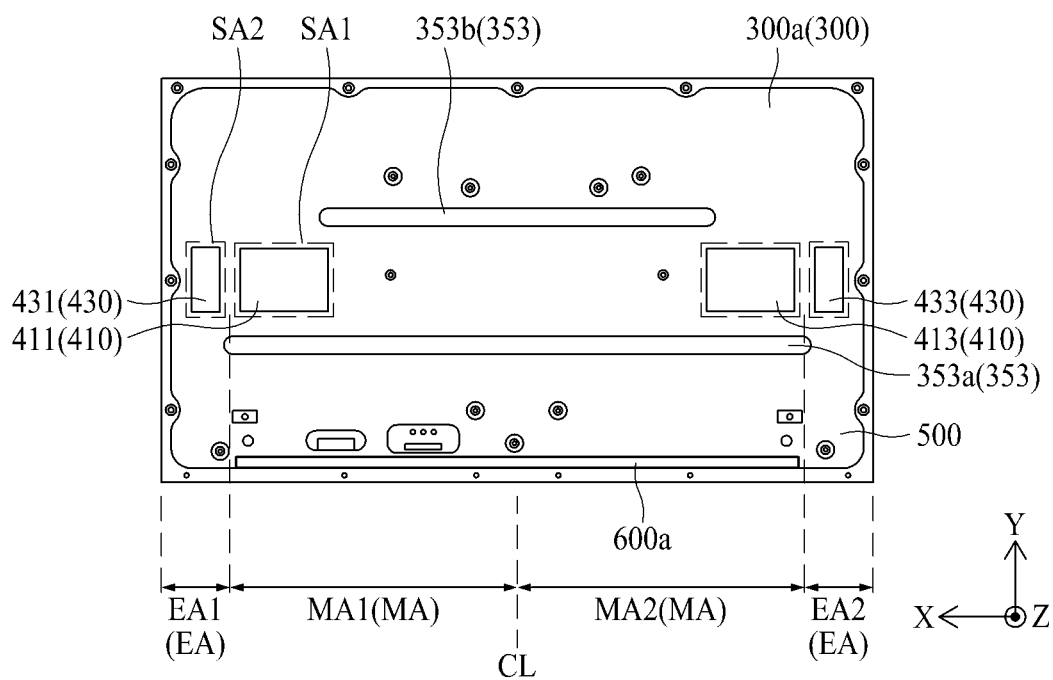
FIGS. 7 to 9 illustrate an embodiment of various arrangements of a first coupling member disposed at a first cover.
Figure 8:
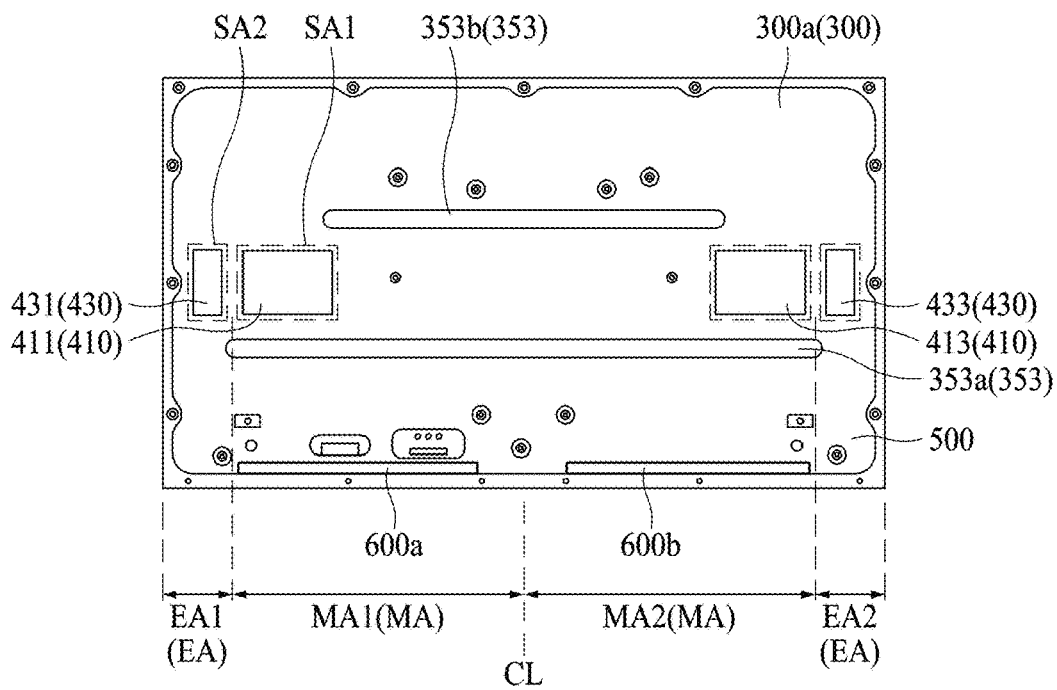
Figure 9:
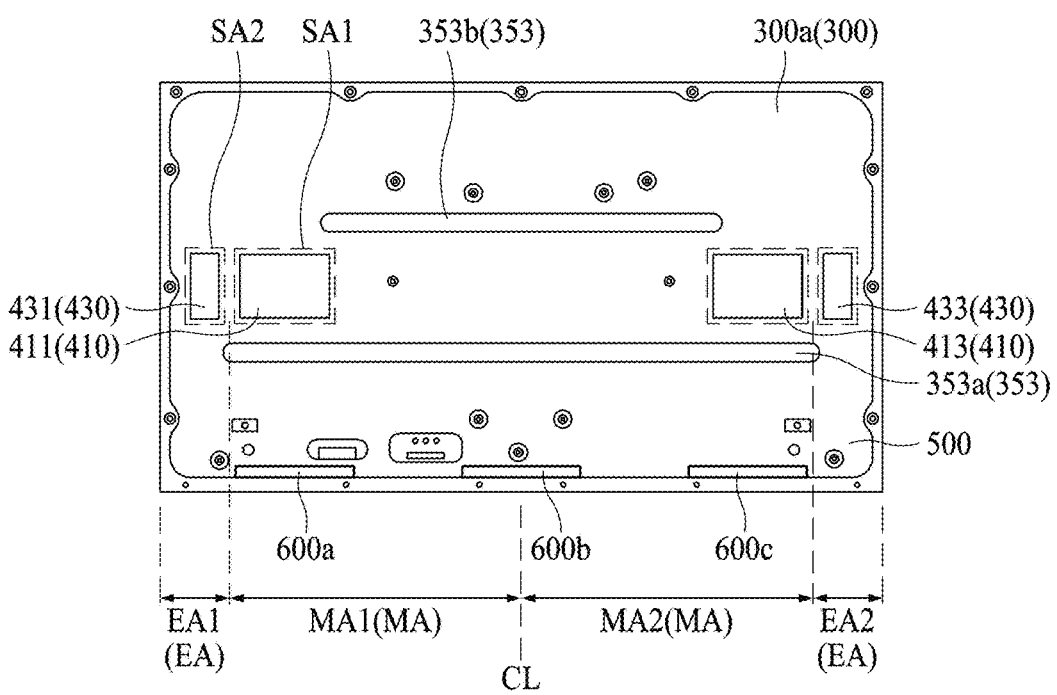

FIG. 2 illustrates a vibration apparatus and a second cover disposed at a first cover of the display apparatus illustrated in FIG. 1. FIG. 3 is a cross-sectional view taken along line I-I' illustrated in FIG. 2. FIG. 4 is an enlarged view of a portion 'A' illustrated in FIG. 3. FIG. 5 is a cross-sectional view taken along line II-II' illustrated in FIG. 2. FIG. 6 is an enlarged view of a portion 'B' illustrated in FIG. 5. FIGS. 7 to 9 illustrate embodiments of various arrangements of the first coupling member disposed at the first cover.

With reference to FIGS. 2 to 9, a display apparatus according to an embodiment of the present disclosure may include a front member 100, a display device 200, a first cover 300, a vibration apparatus 400, and a second cover 500. The configuration of the display apparatus according to an embodiment of the present disclosure is not limited thereto. For example, the first cover 300 may be a rear cover, and the second cover 500 may be a shield cover, and embodiments of the present disclosure are not limited thereto.

The front member 100 may configure a foremost structure of the display apparatus. For example, the front member 100 may be disposed at the display device 200 and may protect a screen of the display device 200. For example, the front member 100 may cover (or overlay) a front surface of the display device 200 to protect the display device 200 from an external impact. Moreover, the front member 100 may vibrate together with the vibration of the display device 200 to generate a sound S1 and S2.

According to an embodiment of the present disclosure, the front member 100 may include a transparent plastic material, a glass material, or a tempered glass material. For example, the front member 100 may include one of sapphire glass and gorilla glass or a stacked structure thereof. As another embodiment, the front member 100 may include a transparent plastic material such as polyethyleneterephthalate (PET). The front member 100 may include tempered glass based on a scratch resistance and transparency. For example, the front member 100 may be a front structure, a front window, a cover window, a glass window, a cover screen, a screen cover, a window glass, or the like, but embodiments of the present disclosure are not limited thereto.

According to an embodiment of the present disclosure, the front member 100 may cover (or overlay) a non-display area other than a display area of the display panel 210 of the display device 200. The front member 100 according to an embodiment of the present disclosure may include a transparent area overlapping the display area of the display panel 210 and a non-transparent area (or a light blocking area) overlapping the non-display area of the display panel 210. For example, the non-transparent area may cover (or overlay) not only the non-display area of the display panel 210, but also the non-display area where an image is not displayed in the display apparatus.

According to an embodiment of the present disclosure, the front member 100 may have a shape corresponding to the outer shape or outer periphery of the display device 200 or the display panel 210. The front member 100 according to an embodiment of the present disclosure may have a polygonal shape such as a rectangular shape or a square shape, or may have a non-polygonal shape including at least one side having a curve shape, but embodiments of the present disclosure are not limited thereto.

The display device 200 may be disposed at a rear surface (or a back surface) of the front member 100, and may display an image. For example, the image may include an electronic image, a digital image, or the like. For example, the display device 200 may a liquid crystal display device, but the type of the display device 200 is not limited thereto. For example, the display device 200 may be a display device such as a light emitting display device, an electrophoretic display device, a micro light emitting diode display device, an electrowetting display device, a quantum dot light emitting display device, or the like.

According to an embodiment of the present disclosure, a rear surface (or a back surface) of the display device 200 may include a center portion CP and periphery portions EP. For example, the rear surface of the display device 200 may be divided into the center portion CP and two periphery portions EP parallel to each other with the center portion CP therebetween.

The center portion CP of the display device 200 may be divided into a first center portion CP1 and a second center portion CP2. For example, the first center portion CP1 may be a left portion (or a left center portion) of the center portion CP, and the second center portion CP2 may be a right portion (or a right center portion) of the center portion CP. With respect to a first direction X (or a widthwise direction) of the display device 200, the first center portion CP1 and the second center portion CP2 may be a left-right (or horizontally) symmetrical with respect to a center line CL of the display device 200.

The display device 200 according to an embodiment of the present disclosure may include a display panel 210, a driving circuit part 220, a backlight 230, and a panel guide 240, but the configuration of the display device 200 according to an embodiment of the present disclosure is not limited thereto.

The display panel 210 may be disposed at a rear surface of the front member 100, and may display an image. For example, the image may include an electronic image, a digital image, or the like. For example, the display panel 210 may a liquid crystal display panel, but the type of the display panel 210 is not limited thereto. For example, the display panel 210 may be a display panel such as any one among a light emitting display panel, an electrophoresis display panel, a micro light emitting diode display panel, a flexible light emitting display panel, a flexible micro light emitting diode display panel, a plasma display panel, an electrowetting display panel, or a quantum dot light-emitting display panel, or the like.

The display panel 210 according to an embodiment of the present disclosure may be configured to display an image using the light irradiated from the backlight 230. Moreover, the display panel 210 may act as a touch sensor that senses a user touch applied to the front member 100. The display panel 210 may output the sound S according to a vibration of the vibration apparatus 400, or may generate a haptic feedback (or a haptic vibration) responding to the user touch.

The display panel 210 may be disposed at the rear surface of the front member 100 through a bonding process using a panel bonding member (or an adhesive member, or a transparent adhesive member). The panel bonding member may include a pressure sensitive adhesive (PSA), an optically clear adhesive (OCA), or an optically clear resin (OCR), but embodiments of the present disclosure are not limited thereto.

The display panel 210 according to an embodiment of the present disclosure may have a polygonal shape such as a rectangular shape or a square shape, or may have a non-polygonal shape including at least one side having a curve shape, but embodiments of the present disclosure are not limited thereto. The display panel 210 may have a shape which is the same as or different from the front member 100. As an embodiment, the front member 100 may have a rectangular shape, and the display panel 210 may have a rectangular shape having a size that is smaller than the front member 100. As another embodiment, the front member 100 may have a non-polygonal shape, and the display panel 210 may have a non-polygonal shape or a rectangular shape each having a size that is smaller than the front member 100.

The display panel 210 may act as a vibration plate, which vibrates based on vibrations of first and second vibration devices 410 and 430 to output the sound S1 and S2 to the forward region FD. For example, the display panel 210 may simultaneously or sequentially output a first sound S1 of a first pitched sound band based on the vibration of the first vibration device 410 and a second sound S2 of a second pitched sound band based on the vibration of the second vibration device 430 to the forward region FD thereof. The first pitched sound band may be the same or different from the second pitched sound band according to an embodiment of the present disclosure. For example, the second pitched sound band may be higher than the first pitched sound band. For example, the first sound S1 having the first pitched sound band may be output from a center portion CP of the display panel 210 to the forward region FD, and the second sound S2 having the second pitched sound band may be output from the periphery portion EP of the display panel 210 to the forward region FD, but embodiments of the present disclosure are not limited thereto.

The display panel 210 according to an embodiment of the present disclosure may include a first substrate 211, a second substrate 212, a first polarization member 213, and a second polarization member 214, but the configuration of the display panel 210 according to an embodiment of the present disclosure is not limited thereto.

The first substrate 211 may be a lower substrate or a thin film transistor (TFT) array substrate. The first substrate 211 may include a pixel array including a plurality of pixels which are respectively provided in a plurality of pixel areas formed at intersections between a plurality of gate lines and a plurality of data lines. Each of the plurality of pixels may include a TFT connected to a gate line and a data line, a pixel electrode connected to the TFT, and a common electrode which is provided adjacent to the pixel electrode and is supplied with a common voltage.

The first substrate 211 may further include a pad portion provided at a first periphery thereof and a gate driving circuit provided at a second periphery thereof. The pad portion may transfer a signal, supplied from the outside, to the pixel array and the gate driving circuit. For example, the pad portion may include a plurality of data pads connected to a plurality of data lines through a plurality of data link lines and a plurality of gate input pads connected to the gate driving circuit through gate control signal lines.

The gate driving circuit according to an embodiment of the present disclosure may be embedded (or integrated) into a second periphery of the first substrate 211 and may be connected to the plurality of gate lines in one-to-one relationship. For example, the gate driving circuit may be implemented with a shift register including a transistor, which is formed through the same process as the TFT provided in the pixel area. For example, the gate driving circuit may be implemented in the driving circuit part 120 without being embedded into the first substrate 211.

The second substrate 212 may be an upper substrate or a color filter array substrate. For example, the second substrate 212 may include a pixel defining pattern to define an opening area overlapping the pixel area formed at the first substrate 211, and a color filter layer formed at the opening area. The second substrate 212 may be bonded to the first substrate 211 with a liquid crystal layer therebetween using a sealant.

The liquid crystal layer may be disposed between the first substrate 211 and the second substrate 212. For example, the liquid crystal layer may include a liquid crystal including liquid crystal molecules where an alignment direction thereof is changed based on an electric field generated by the common voltage and a data voltage applied to a pixel electrode for each pixel.

The first polarization member 213 may be attached at a rear surface of the first substrate 211 and may polarize light which is incident from the backlight 230 along the first polarization axis to irradiate the first substrate 211. The second polarization member 213 may be attached at an upper surface of the second substrate 212 and may polarize light which passes through the second substrate 212 and is output to the outside.

The display panel 210 may drive the liquid crystal layer based on an electric field which is generated in each pixel by the data voltage and the common voltage applied to each pixel, and thus, may display an image based on light passing through the liquid crystal layer.

The display panel 210 according to an embodiment of the present disclosure may further include a touch electrode layer for sensing a user touch applied to the front member 100.

The touch electrode layer may include a plurality of touch electrodes for sensing the user touch. Each of the plurality of touch electrodes may act as a touch sensor for sensing the user touch, based on a mutual capacitance type or a self-capacitance type. For example, the touch electrode layer may be implemented as a touch panel including the plurality of touch electrodes. For example, the touch panel may be an add-on type touch panel or an in-cell type touch panel.

With reference to FIGS. 5 and 6, the driving circuit part 220 may be connected to a pad portion provided at the first periphery portion of the display panel 210 and may be configured to display an image corresponding to video data supplied from the display host system on each pixel of the display panel 210. For example, the driving circuit part 220 may be connected to a pad portion provided at the first periphery portion of the first substrate 211 of the display panel 210. For example, the driving circuit part 220 may sense a user touch through the plurality of touch electrodes disposed at the touch electrode layer of the display panel 210.

According to an embodiment of the present disclosure, the driving circuit part 220 may be disposed at the first cover 300. For example, the driving circuit part 220 may extend from a first periphery of the display panel 210 along a side surface and a rear surface of the first cover 300 and may be fixed to or connected to the rear surface of the first cover 300.

The driving circuit part 220 according to an embodiment of the present disclosure may include at least one flexible circuit film 221, at least one data driving integrated circuit (IC) 222, a printed circuit board (PCB) 223, a control circuit 224, and a connector 225, but a configuration of the driving circuit part 220 is not limited thereto. The connector 225 may be a user connector, but embodiments of the present disclosure are not limited thereto.

Each of the at least one flexible circuit film 221 may be attached at a pad portion provided in a first periphery of the first substrate 211 of the display panel 210 using a film attachment process. Each of the at least one flexible circuit film 221 may be bent to surround a side surface (or a first side surface) of each of the display panel 210 and the backlight 230 and may be connected to the PCB 223 at one periphery (or a first rear periphery) of the rear surface of the first cover 300.

According to an embodiment of the present disclosure, the at least one flexible circuit film 221 may extend along a region between the second cover 500 and the first cover 300 and may be disposed at a first rear periphery of the first cover 300. As an embodiment, a portion of the at least one flexible circuit film 221 may be disposed between the second cover 500 and the first cover 300. For example, the at least one flexible circuit film 221 may extend along a region between the panel guide 240 and the first cover 300 and may be disposed at the first rear periphery of the first cover 300. For example, a portion of the at least one flexible circuit film 221 may be disposed between the panel guide 240 and the second cover 500.

The at least one data driving IC 222 may be individually mounted on the at least one flexible circuit film 221. The data driving IC 222 may receive pixel data and a data control signal provided from the control circuit 224, convert the pixel data into a pixel-based analog data signal based on the data control signal, and supply the analog data voltage to a data line. Optionally, each of the at least one data driving IC 222 may be directly mounted at a first periphery of the first substrate 211 through a chip bonding process and may be connected to a plurality of data lines, and in this case, the at least one flexible circuit film 221 may be omitted.

The PCB 223 may be connected to the at least one flexible circuit film 221 in common. For example, the PCB 223 may be connected to the display panel 210 through the at least one flexible circuit film 221. For example, the PCB 223 may be electrically connected to the other side of the at least one flexible circuit film 221 through a film attachment process using an anisotropic conductive film and may be disposed at the first rear periphery of the first cover 300 based on bending of the at least one flexible circuit film 221. The first rear periphery of the first cover 300 may be a region, where the at least one flexible circuit film 221 and the PCB 223 are disposed, of the rear surface of the first cover 300.

According to an embodiment of the present disclosure, the PCB 223 may be disposed at the rear surface of the first cover 300. For example, the PCB 223 may be disposed at a rear surface of a first reinforcement portion 351 of the first cover 300. For example, the PCB 223 may be disposed at a rear surface of a 1-2$^{nd}$ reinforcement portion 351b of the first reinforcement portion 351. For example, the PCB 223 may include a first connection region 223a corresponding to (or overlapping) the first reinforcement portion 351 of the first cover 300 and a second connection region 223b corresponding to (or overlapping) a first cover portion 300a of the first cover 300. For example, the second connection region 223b may be a region which extends from the first connection region 223a to the first cover portion 300a.

The PCB 223 according to an embodiment of the present disclosure may be disposed at (or fixed to or connected to) the rear surface of the first cover 300 by a first coupling member (or a substrate fixing member, or a substrate connection member) 600. For example, the first coupling member 600 may be disposed between the rear surface of the first cover 300 and the first surface of the PCB 223. For example, as illustrated in FIG. 7, one coupling member 600a may be disposed at the first cover 300. For example, as illustrated in FIGS. 8 and 9, a plurality of coupling members 600a to 600c may be spaced apart from one another by a certain interval and may be disposed at the first cover 300. As described above, the number and positions of first coupling members 600 may be variously modified.

According to an embodiment of the present disclosure, the first coupling member 600 may be disposed not to correspond to the second vibration device 430, or a portion or the entire first coupling member 600 may be disposed to correspond to the first coupling member 600. For example, the first coupling member 600 may be disposed not to correspond to the first vibration device 410. For example, a portion or the entire first coupling member 600 may be disposed to correspond to the first vibration device 410. For example, as illustrated in FIGS. 8 and 9, when the first coupling member 600 is divisionally disposed, a portion or all of at least one 600a and 600b of a divided plurality of first coupling members may be disposed to correspond to the first vibration device 410. For example, when the first coupling member 600 is divisionally disposed, light leakage may be prevented better in FIGS. 8 and 9 than FIG. 7, and thus, the reliability of the display apparatus may be enhanced.

According to an embodiment of the present disclosure, the first coupling member 600 may include a double-sided tape or a double-sided foam including an adhesive resin (or an adhesive layer), but embodiments of the present disclosure are not limited thereto. For example, the adhesive resin (or the adhesive layer) of the first coupling member 600 may include a silicone-based adhesive material, an acrylic-based adhesive material, or an urethane-based adhesive material, but embodiments of the present disclosure are not limited thereto. For example, the adhesive resin (or the adhesive layer) of the first coupling member 600 may include a silicone-based or urethane-based adhesive material which relatively has a ductile characteristic compared to an acrylic-based adhesive material having a characteristic where hardness is relatively high, so as to prevent or minimize the transfer of a vibration, based on a vibration of the vibration apparatus 400 or/and the display device 200, of the first cover 300 to the PCB 223, but embodiments of the present disclosure are not limited thereto.

As described above, because the first coupling member 600 is disposed between the PCB 223 and the first cover 300, the transfer of a vibration, based on a vibration of the vibration apparatus 400 or/and the display device 200, of the first cover 300 to the PCB 223 may be prevented or minimized. Also, the PCB 223 and the first cover 300 may be connected or fixed to each other by the first coupling member 600, and thus, even when the PCB 223 or/and the first cover 300 vibrate(s), the PCB 223 may be prevented from contacting the first cover 300 and noise caused by a friction may be prevented. Moreover, a vibration of the PCB 223 may be minimized, and thus, the damage of the PCB 223 may be prevented or minimized, thereby preventing or minimizing a detachment phenomenon (or a peeling phenomenon) between the flexible circuit film 221 and the PCB 223 and preventing or minimizing the damage of the data driving IC 222.

The control circuit 224 may be disposed at (or mounted on) the PCB 223. For example, the control circuit 224 may be disposed at the rear surface of the PCB 223 and may be covered and protected by the second cover 500. For example, the control circuit 224 may receive a timing synchronization signal and video data supplied from a display host system through a connector 225. For example, the timing synchronization signal may include a vertical synchronization signal, a horizontal synchronization signal, a data enable signal, and a main clock signal, but embodiments of the present disclosure are not limited thereto.

The control circuit 224 may generate a gate control signal for controlling a driving timing of a gate driving circuit and a data control signal for controlling a driving timing of the at least one data driving IC 222, based on the timing synchronization signal. For example, the gate control signal may include at least one gate start signal and a plurality of gate shift clocks, or the like. The data control signal may include a source start signal, a source shift clock, and a source output enable signal, or the like.

The connector 225 may receive various signals including a sound signal from the display host system and may provide the received signal to the control circuit 224.

According to an embodiment of the present disclosure, the connector 225 may be disposed at (or mounted on) an end (or one side) of the PCB 223. For example, the connector 225 may be disposed at (or mounted on) a connection region 223c provided at an extending end (or one side) of the second connection region 223b of the PCB 223.

According to an embodiment of the present disclosure, the connector 225 may include a first connection region 223a corresponding to (or overlapping) the PCB 223 and a second connection region 223b which extends from the first connection region 223a and is exposed, and does not correspond to (or overlap) the PCB 223. For example, the second connection region 223b may overlap the first cover portion 300a of the first cover 300. For example, a third coupling member 800 (or a connection fixing member) may be disposed between the second connection region 223b and the first cover portion 300a.

The third coupling member 800 may allow the connector 225 to be connected or fixed to the first cover 300, and thus, a coupling force between the first cover 300 and the PCB 223 with the connector 225 disposed thereon may increase. The third coupling member 800 may include a double-sided tape or a double-sided foam including an adhesive resin (or an adhesive layer), but embodiments of the present disclosure are not limited thereto. For example, the adhesive resin (or an adhesive layer) of the third coupling member 800 may include a silicone-based adhesive material, an acrylic-based adhesive material, or an urethane-based adhesive material, but embodiments of the present disclosure are not limited thereto. For example, the adhesive resin (or an adhesive layer) of the third coupling member 800 may include a silicone-based or urethane-based adhesive material which relatively has a ductile characteristic compared to an acrylic-based adhesive material having a characteristic where hardness is relatively high, so as to prevent or minimize the transfer of a vibration, based on a vibration of the vibration apparatus 400 or/and the display device 200, of the first cover 300 to the PCB 223, but embodiments of the present disclosure are not limited thereto.

According to an embodiment of the present disclosure, the driving circuit part 220 may further include a touch driving circuit connected to the touch electrode layer of the display panel 210.

The touch driving circuit may sense a user touch through each of the plurality of touch electrodes disposed at the touch electrode layer to generate touch raw data and may transmit coordinate information about the user touch to the display host system based on the generated touch raw data.

The display host system may include a main board, various circuits mounted on the main board, various storage mediums, a peripheral device, a keyboard, and a power device, or the like. The various circuits mounted on the main board may include a central control circuit for processing various information, an image processing circuit for processing data according to control by the central control circuit, and a sound processing circuit for processing a sound according to control by the central control circuit. The display host system may process various information, generate the timing synchronization signal and the video data to provide the timing synchronization signal and the video data to the control board 224, and may generate a driving signal including a sound signal or a haptic feedback signal to provide the driving signal to the control board 224. For example, the sound signal may be synchronized with the video data, or may not be synchronized with the video data.

The display host system may execute an application program associated with touch coordinates corresponding to coordinate information about a user touch provided from the touch driving circuit, or may perform a user interface based on touch drawing of a user. Also, the display host system may generate a driving signal including a haptic feedback signal corresponding to the coordinate information about the user touch provided from the touch driving circuit.

With reference to FIGS. 3 and 4, the backlight 230 may be disposed at a rear surface of the display panel 210 and may irradiate light onto the rear surface of the display panel 210. For example, the backlight 230 may be disposed between the display panel 210 and the first cover 300 and may be supported by the first cover 300.

The backlight 230 according to an embodiment of the present disclosure may include a light guide plate 231, a light source part 232, a reflective sheet 233, and an optical sheet part 234, but the configuration of the backlight 230 according to an embodiment of the present disclosure is not limited thereto.

The light guide plate 231 may include a light incident surface which is disposed at the first cover 300 to overlap the display panel 210 and is provided in at least one sidewall thereof. For example, the light guide plate 231 may include a light-transmitting plastic or glass material. The light guide plate 231 may transfer (or output) light, which is incident through the light incident surface from the light source part, to the display panel 210. For example, the light guide plate 231 may be referred to as a light guide member or a flat light source, or the like, but embodiments of the present disclosure are not limited thereto.

The light source part 232 may irradiate light onto the light incident surface provided at the light guide plate 231. The light source part 232 may be disposed at the first cover 300 to overlap a first periphery of the display panel 210. For example, the light source part 232 may be disposed between the panel guide 240 and the first cover 300. For example, the light source part 232 may include a plurality of light emitting diode (LED) devices which are mounted on a light source printed circuit board and irradiate lights onto the light incident surface of the light guide plate 231.

The reflective sheet 233 may be disposed at the first cover 300 to be covered a rear surface of the light guide plate 231. The reflective sheet 233 may reflect light, which is incident from the light guide plate 231, toward the light guide plate 231 to minimize or reduce the loss of the light.

The optical sheet part 234 may be disposed at a front surface of the light guide plate 231 and may enhance a luminance characteristic of light output from the light guide plate 231. For example, the optical sheet part 234 may include a lower diffusive sheet, a lower prism sheet, and an upper first prism sheet, but embodiments of the present disclosure are not limited thereto. For example, the optical sheet part 234 may be configured by a stacked combination of one or more sheets among a diffusive sheet, a prism sheet, a dual brightness enhancement film (DBEF), and a lenticular sheet, or may be configured with one composite sheet having a light diffusing function and a light collecting function.

The panel guide 240 may be disposed between the display panel 210 and the backlight 230. For example, the panel guide 240 may be disposed between a rear periphery portion EP of the display panel 210 and a front periphery portion of the backlight 230 and may support the rear periphery portion EP of the display panel 210. For example, the panel guide 240 may cover a side surface (or a lateral surface) of the backlight 230. For example, the panel guide 240 may cover and support a side surface of the first cover 300.

According to an embodiment of the present disclosure, the panel guide 240 may maintain an interval between the display panel 210 and the backlight 230 and may provide a sound transfer space STS between the display panel 210 and the backlight 230.

According to an embodiment of the present disclosure, the panel guide 240 may have a tetragonal frame shape which includes an opening portion overlapping a center portion CP, other than the rear periphery portion EP, of the display panel 210, and a configuration of the panel guide 240 is not limited thereto.

As described above, because the panel guide 240 has a tetragonal frame shape including an opening portion, the panel guide 240 may provide the sound transfer space STS between a rearmost surface of the display panel 210 and an uppermost surface of the backlight 230 facing each other with an opening portion therebetween, thereby preventing or minimizing the leakage (or loss) of a sound pressure level transferred to the sound transfer space STS. The sound transfer space STS may have a function of a sound pressure generating space, where a sound pressure is generated based on a vibration of the backlight 230, and a function of a panel vibration space which enables a vibration of the display panel 210 to be smoothly performed based on a sound pressure level.

According to an embodiment of the present disclosure, the panel guide 240 may be disposed at the rear periphery portion EP of the display panel 210 by a first connection member (or a panel connection member) 241. For example, the panel guide 240 may be disposed at the front periphery portion of the backlight 230 by a second connection member (or a unit connection member) 242.

According to an embodiment of the present disclosure, the first connection member 241 may be disposed between the rear periphery portion EP of the display panel 210 and the panel guide 240, and the second connection member 242 may be disposed between the front periphery portion of the backlight 230 and the panel guide 240.

According to an embodiment of the present disclosure, a front surface of the first connection member 241 may be connected to the first substrate 211 or the first polarization member 213 of the display panel 210 and may be directly connected to the rear periphery portion EP of the first substrate 211 in order to enhance an adhesive force corresponding to the display panel 210. In this case, the first connection member 241 may be attached at the rear periphery portion EP of the first substrate 211 to surround a side surface of the first polarization member 213, thereby preventing lateral light leakage occurring in the first polarization member 213.

The first connection member 241 may provide the sound transfer space STS between the display panel 210 and the panel guide 240. For example, the sound transfer space STS may be formed as a four-side-sealed type or a closed loop type, but embodiments of the present disclosure are not limited thereto.

According to an embodiment of the present disclosure, the panel guide 240 may further include a groove 243 into which the second connection member 242 is inserted (or accommodated), and the second connection member 242 may be inserted (or accommodated) into the groove 243. For example, the groove 243 may be formed at a rear surface of the panel guide 40 (or an opposite surface of the backlight). For example, the second connection member 242 may have a thickness (or a height) which enables the backlight 230 to be connected to the panel guide 240 despite being inserted (or accommodated) into the groove 243. For example, the second connection member 242 may have a thickness (or a height) which is equal to a thickness (or a height) of the groove 243 or is greater than a thickness (or a height) of the groove 243 within an error or tolerance range. As described above, because the second connection member 242 is inserted or accommodated into the groove 242, an increase in thickness of the display apparatus caused by the second connection member 242 may be prevented. Moreover, the second connection member 242 may be excluded in a variable which determines a height of the sound transfer space STS, and thus, a height of the sound transfer space STS may be determined based on a thickness of the panel guide 240 and a thickness of the first connection member 241, thereby accurately controlling a height of the sound transfer space STS to output a desired sound.

According to an embodiment of the present disclosure, the first and second connection members 241 and 242 may include an acrylic-based or urethane-based adhesive member, but embodiments of the present disclosure are not limited thereto. For example, the first and second connection members 241 and 242 may include an acrylic-based adhesive member having a characteristic where an adhesive force is relatively good and hardness is high, so that a vibration of the panel guide 240 is well transferred to the display panel 210. In this case, the first and second connection members 241 and 242 may include an acrylic-based adhesive layer, a double-sided foam adhesive pad, or an acrylic-based adhesive resin curing layer.

According to an embodiment of the present disclosure, the panel guide 240 may include a plastic material, a metal material, or a mixed material of a plastic material and a metal material, but a material of the panel guide 240 is not limited thereto. For example, the panel guide 240 may act as a vibration transfer member which transfers a vibration, generated by the vibration apparatus 400, to the rear periphery portion EP of the display panel 210. Therefore, the panel guide 240 may transfer the vibration, generated by the vibration apparatus 400, to the display panel 210 without being lost. For example, the panel guide 240 may include a metal material for transferring the vibration, generated by the vibration apparatus 400, to the display panel 210 in a state of maintaining the stiffness of the display panel 210, but embodiments of the present disclosure are not limited thereto.

The panel guide 240 according to an embodiment of the present disclosure may include a supporting part 240a and a side part 240b. For example, the panel guide 240 may have a cross-sectional structure having a ⌉-shape or a ⌈-shape based on a coupling structure of the supporting part 240a and the side part 240b.

The supporting part 240a according to an embodiment of the present disclosure may be disposed between the display panel 210 and the backlight 230. For example, the supporting part 240a may be disposed between the rear periphery portion EP of the display panel 210 and the front periphery portion of the backlight 230 and may support the rear periphery portion EP of the display panel 210.

According to an embodiment of the present disclosure, the supporting part 240a may be disposed between the rearmost surface of the display panel 210 and the uppermost surface of the backlight 230. For example, the supporting part 240a may maintain an interval between the display panel 210 and the backlight 230 and may provide the sound transfer space STS between the display panel 210 and the backlight 230.

According to an embodiment of the present disclosure, the supporting part 240a may have a tetragonal frame shape which includes an opening portion overlapping a center portion CP, other than the rear periphery portion EP, of the display panel 210, and a configuration of the supporting part 240a is not limited thereto.

According to an embodiment of the present disclosure, the first connection member 241 may be disposed at a front surface of the supporting part 240a and may be disposed at a rear surface of the supporting part 240a. For example, the groove 243 may be disposed at the rear surface of the supporting part 240a.

The side part (or a guide sidewall) 240b according to an embodiment of the present disclosure may be connected to the supporting part 240a and may cover the side surface (or a lateral surface) of the backlight 230. For example, the side part 240b may cover the side surface (or a lateral surface) of the first cover 300. For example, the side part 240b may be bent from the supporting part 240a to the side surface of the first cover 300 and may cover and support the side surface of the first cover 300. For example, the flexible circuit film 221 may be disposed at the side part 240b by a third connection member 244. For example, the third connection member 244 may be disposed between the side part 240b and the flexible circuit film 221 and may enable the flexible circuit film 221 to be disposed at (or fixed to or connected to) the side part 240b.

The first cover 300 may be configured to support the display device 200 and may cover a rear surface of the display device 200. Also, the first cover 300 may be configured to support the vibration apparatus 400. The first cover 300 according to an embodiment of the present disclosure may act as a vibration plate, and may include a metal material or a metal alloy material. For example, the first cover 300 may include one or more of an aluminum (Al) material, aa magnesium (Mg) material, a magnesium (Mg) alloy material, a magnesium (Mg)—Lithium (Li) alloy material, and an aluminum (Al) alloy material, but embodiments of the present disclosure are not limited thereto.

The first cover 300 according to an embodiment of the present disclosure may include a first cover portion (a rear portion) 300a and a second cover portion (a side portion) 300b. For example, the first cover portion 300a may support the rear surface of the display device 200. The second cover portion 300b may be connected to the periphery portion EP of the first cover portion 300a and may support the periphery portion EP of the display device 200. The configuration of the first cover 300 according to an embodiment of the present disclosure is not limited thereto.

The first cover portion 300a of the first cover 300 may be configured to support the display device 200 and may cover a rear surface of the display device 200. The first cover portion 300a may have a plate-shaped structure, support the backlight 230 of the display device 200, and support the vibration apparatus 400. For example, the first cover portion 300a may directly contact a rear surface of the reflective sheet 233, and thus, may act to transmit a vibration, generated based on a vibration of the vibration apparatus 400, to the reflective sheet 133 of the backlight unit 130.

The first cover portion 300a may include a middle region MA corresponding to (or overlapping) the center portion CP of the display device 200 and a periphery region EA corresponding to (or overlapping) the periphery portion EP of the display device 200.

With reference to FIGS. 2 and 3, the middle region MA (or a first cover region) of the first cover portion 300a according to an embodiment of the present disclosure may include a first middle region MA1 (or a left middle region) corresponding to (or overlapping) a first center portion CP1 of the display device 200 and a second middle region MA2 (or a right middle region) corresponding to (or overlapping) a second center portion CP2 of the display device 200, with respect to the center line CL of the display device 200.

Each of the first middle region MA1 and the second middle region MA2 of the first cover portion 300a may include a first supporting region SA1 to support the first vibration device 410. For example, a center portion of the first supporting region SA1 may be disposed on a horizontal line (or a center horizontal line) of the display device 200 with respect to a second direction Y (or a lengthwise direction), or may be disposed under or above the horizontal line along the second direction Y.

A periphery region EA (or a second cover region) of the first cover portion 300a according to an embodiment of the present disclosure may include a first periphery region EA1 (or a left periphery region) corresponding to (or overlapping) a first periphery portion EP1 of the display device 200 and a second periphery region EA2 (or a right periphery region) corresponding to (or overlapping) a second periphery portion EP2 of the display device 200, with respect to the center line CL of the display device 200.

Each of the first periphery region EA1 and the second periphery region EA2 of the first cover portion 300a may include a second supporting region SA2 to support the second vibration device 430. For example, a center portion of the second supporting region SA2 may be disposed on a horizontal line (or a center horizontal line) of the display device 200 with respect to a second direction Y (or a lengthwise direction), or may be disposed under or above the horizontal line along the second direction Y.

In FIGS. 2 to 6, the first cover portion 300a is illustrated as being adhered (close contacted) to the backlight 230, but embodiments of the present disclosure are not limited thereto. For example, the first cover portion 300a may be spaced apart from the backlight 230 by a distance corresponding to a certain space, and an air layer may be provided in a separation space therebetween. For example, the separation space between the first cover portion 300a and the backlight 230 may be disposed at the center portion CP of the display device 200.

With reference to FIGS. 3 and 4, the first cover 300 according to an embodiment of the present disclosure may include a first hole 310 and a second hole 320. For example, the first hole 310 and the second hole 320 may be provided at the first cover portion 300a.

The first hole 310 (or a first through hole, or a first rear cover hole) may be disposed at the first rear region of the first cover 300 overlapping with the first vibration device 410 and may expose a portion of the rear surface of the backlight 230. For example, a portion of the reflective sheet 233 of the backlight 230 may be exposed through the first hole 310. For example, the first hole 310 may be provided at the middle region MA of the first cover portion 300a. The first hole 310 may be provided to pass through the first supporting region SA1 of the first cover portion 300a in the middle region MA of the first cover portion 300a along a thickness direction Z of first cover portion 300a.

According to an embodiment of the present disclosure, the first hole 310 is a path which the first vibration device 410 passes, the first vibration device 410 may be accommodated through the first hole 310. For example, the first hole 310 may provide a first gap space that is between the backlight 230 and the first vibration device 410. For example, the first hole 310 may provide a first gap space that is between the reflective sheet 233 of the backlight 230 and the first vibration device 410. For example, the first gap space may be referred to as a vibration space based on driving of the first vibration device 410, a sound pressure space (or a resonance portion) in which a sound pressure is generated based on a vibration of the first vibration device 410, or a sound wave propagation path (or a sound energy input portion) through which a sound wave generated based on the vibration of the first vibration device 410 is directly propagated to the display device 200, but embodiments of the present disclosure are not limited thereto.

According to an embodiment of the present disclosure, when the first hole 310 is a path through which the first vibration element 410 passes, a size (or a width) of the first hole 310 may be smaller than the first vibration device 410. For example, when the first hole 310 provides the first gap space, a size of the first hole 310 may be smaller than the size of the first vibration device 410. For example, the first hole 310 may have the same shape as the first vibration device 410, or may have a tetragonal shape or a circular shape, but embodiments of the present disclosure are not limited thereto.

The second hole 320 (or a second through hole, or a second rear cover hole) may be disposed at the second rear region of the first cover 300 overlapping with the second vibration device 430 and may expose a portion of the rear surface of the backlight 230. For example, a portion of the reflective sheet 233 of the backlight 230 may be exposed through the second hole 320. For example, the second hole 320 may be provided at the periphery region EA of the first cover portion 300a. The second hole 320 may be provided to pass through the second supporting region SA2 of the first cover portion 300a in the periphery region EA of the first cover portion 300a along a thickness direction Z of first cover portion 300a.

According to an embodiment of the present disclosure, the second hole 320 is a path which the second vibration device 430 passes, the second vibration device 430 may be accommodated through the second hole 320. For example, the second hole 320 may provide a second gap space that is between the backlight 230 and the second vibration device 430. For example, the second hole 320 may provide a second gap space that is between the reflective sheet 233 of the backlight 230 and the second vibration device 430. For example, the second gap space may be referred to as a vibration space based on driving of the second vibration device 430, a sound pressure space (or a resonance portion) in which a sound pressure is generated based on a vibration of the second vibration device 430, or a sound wave propagation path (or a sound energy input portion) through which a sound wave generated based on the vibration of the second vibration device 430 is directly propagated to the display device 200, but embodiments of the present disclosure are not limited thereto.

According to an embodiment of the present disclosure, when the second hole 320 is a path through which the second vibration element 430 passes, a size (or a width) of the second hole 320 may be smaller than the second vibration device 430. For example, when the second hole 320 provides the second gap space, a size of the second hole 320 may be smaller than the size of the second vibration device 430. For example, the second hole 320 may have the same shape as the second vibration device 430, or may have a tetragonal shape or a circular shape, but embodiments of the present disclosure are not limited thereto.

The second cover portion 300b of the first cover 300 may be bent from a periphery of the first cover portion 300a toward a front of the display apparatus to cover side surfaces of the backlight 230. For example, the second cover portion 300b may provide a backlight accommodating space above the first cover portion 300a, and may surround side surfaces of the backlight 230 accommodated into (or supported by) the backlight accommodating space. The second cover portion 300b may act to transmit a sound vibration, generated in the first cover portion 300a by the vibration apparatus 400, to the panel guide 240.

According to an embodiment of the present disclosure, the second cover portion 300b may be disposed between the backlight 230 and the panel guide 240. For example, the second cover portion 300b may be disposed between a side surface of the backlight 230 and a side part 240b of the panel guide 240.

As an embodiment, the second cover portion 300b may be connected to the backlight 230 by a fourth connection member 330. For example, the fourth connection member 330 may be disposed between the second cover portion 300b and the side surface of the backlight 230. As another embodiment, the second cover portion 300b may be connected to the panel guide 240 by a fifth connection member 340. For example, the fifth connection member 340 may be disposed between the side part 240b of the panel guide 240 and the second cover portion 300b.

According to an embodiment of the present disclosure, the fourth connection member 330 may include an adhesive member of an acrylic-based material or a urethane-based material, but embodiments of the present disclosure are not limited thereto. For example, the fourth connection member 330 may include an acrylic-based material which is relatively better in adhesive force and hardness than urethane-based material so that a vibration of the panel guide 240 may be transmitted to the display panel 210 well. The fourth connection member 330 may include a double-sided foam adhesive pad having an adhesive layer of the acrylic-based material, or an adhesive resin cured layer of an acrylic-based material.

According to an embodiment of the present disclosure, the fifth connection member 340 may include a double-sided tape or a double-sided foam pad including an adhesive resin (or an adhesive layer), but embodiments of the present disclosure are not limited thereto. As an embodiment, the adhesive resin (or the adhesive layer) of the fifth connection member 340 may include an adhesive material of a silicone-based material, an acrylic-based polymer material, or urethane-based material, but embodiments of the present disclosure are not limited thereto. In order to prevent or minimize a vibration of the panel guide 240 according to the vibration of the vibration apparatus 400 and/or the display device 200 from being transmitted to the driving circuit part 220, each of the adhesive resin and the adhesive layer of the fifth connection member 340 may include the adhesive material of the silicone-based material or the urethane-based material which relatively has a ductile characteristic compared to the acrylic-based material having relatively high hardness.

The first cover 300 according to an embodiment of the present disclosure may further include a reinforcement portion 350. The reinforcement portion 350 may increase or reinforce the stiffness of the first cover 300. For example, the reinforcement portion 350 may protrude from the first cover portion 300a by a certain height to increase or reinforce the stiffness of the first cover 300. For example, the reinforcement portion 350 may be a forming portion of the first cover 300. When the reinforcement portion 350 is configured as the forming portion, an increase in thickness (or height) of the display apparatus caused by a thickness (or a height) of the vibration apparatus 400 may be minimized, and thus, the display apparatus may be slimmed.

With reference to FIGS. 3 to 6, the reinforcement portion 350 may include a first reinforcement portion 351 (or a periphery reinforcement portion) formed along a periphery region EA of the first cover portion 300a.

According to an embodiment of the present disclosure, the first reinforcement portion 351 (or the periphery reinforcement portion) may be formed at a region where the first cover portion 300a is connected to the second cover portion 300b. For example, the first reinforcement portion 351 may protrude in a rearward direction to include an inclined surface which is inclined from an end or one side of the first cover portion 300a, and the second cover portion 300b may be connected to an end or one side of the first reinforcement portion 351.

According to an embodiment of the present disclosure, with reference to FIG. 4, the first reinforcement portion 351 may include a 1-$1^{st}$ reinforcement portion (or an inclined surface) 351a, which is disposed to be inclined in a rearward direction of the first cover portion 300a from the end or the one side of the first cover portion 300a, and a 1-$2^{nd}$ reinforcement portion (or a flat surface) 351b which is disposed (or extend) to be horizontal in a first direction X from an end or one side of the 1-$1^{st}$ reinforcement portion 351a to the side portion 300a. For example, an end or one side of the 1-$2^{nd}$ reinforcement portion 351b may be connected to the second cover portion 300b.

According to an embodiment of the present disclosure, with reference to FIGS. 4 to 6, the PCB 223 of the driving circuit part 220 may be disposed at a rear surface of the first reinforcement portion 351 of the first cover 300. For example, the first coupling member 600 may be disposed between the PCB 223 and the side surface of the first cover portion 300a adjacent to the first reinforcement portion 351. For example, the PCB 223 may be disposed at a rear surface of the 1-$2^{nd}$ reinforcement portion 351b of the first reinforcement portion 351. For example, the PCB 223 may include a first connection region 223a corresponding to (or overlapping) the first reinforcement portion 351 and a second connection region 223b corresponding to (or overlapping) the first cover portion 300a.

As described above, because the first cover 300 includes the first reinforcement portion 351 which protrudes in a rearward direction of the first cover 300a from the end or the one side of the first cover portion 300a, a step height H corresponding to a height (or a depth) of the first reinforcement portion 351 may occur between the first cover portion 300a and the first reinforcement portion 351, and the first coupling member 600 may have a thickness which is thicker than the step height H, based on a thickness or an error corresponding to the step height H. The first coupling member 600 according to an embodiment of the present disclosure may be disposed between the rear surface of the first cover portion 300a and the second connection region 223b of the PCB 223.

With reference to FIGS. 2 and 5, the reinforcement portion 350 may further include one or more second reinforcement portions 353 (or middle reinforcement portions) which are formed at a middle region MA of the first cover portion 300a in parallel with the first direction X, but embodiments of the present disclosure are not limited thereto. For example, the one or more second reinforcement portions 353 may include a 2-$1^{st}$ reinforcement portion 353a and a 2-$2^{nd}$ reinforcement portion 353b which are disposed in parallel with the vibration apparatus 400 therebetween, but embodiments of the present disclosure are not limited thereto.

The vibration apparatus 400 may be disposed at the rear surface of the display device 200 and may vibrate the display device 200. According to an embodiment of the present disclosure, the vibration apparatus 400 may be disposed at the rear surface of the first cover 300 and may vibrate the display device 200. For example, the vibration apparatus 400 may be supported by the display device 200, or may be supported by the first cover 300.

The vibration apparatus 400 according to an embodiment of the present disclosure may include a first vibration device 410 and a second vibration device 420, but embodiments of the present disclosure are not limited thereto. For example, the first vibration device 410 may be a coil type vibration device and the second vibration device 430 may be a film type vibration device, but embodiments of the present disclosure are not limited thereto.

According to an embodiment of the present disclosure, the first vibration device 410 may be referred to as an actuator, an exciter, a transducer, or the like, but embodiments of the present disclosure are not limited thereto. For example, the second vibration device 430 may be referred to as a flexible sound generator, a flexible actuator, a flexible speaker, a flexible piezoelectric speaker, a film actuator, a film type piezoelectric composite actuator, a film speaker, a film type piezoelectric speaker, a film type piezoelectric composite speaker, or the like, but embodiments of the present disclosure are not limited thereto.

The first vibration device 410 may be supported by the first cover 300 and may vibrate the display device 200. For example, the first vibration device 410 may vibrate based on a driving signal including a sound signal or a haptic feedback signal to vibrate (or directly vibrate) the display device 200, and thus, may generate a first sound S1 based on a vibration of the display device 200 or generate a haptic feedback (or a haptic vibration) responding to a user touch.

According to an embodiment of the present disclosure, the first vibration device 410 may be disposed at the rear surface of the first cover 300. For example, some portion of the first vibration device 410 may contact (or directly contact) the rear surface of the display device 200 through a first hole 310. For example, the first vibration device 410 may be a vibration device which includes a magnet, a bobbin, and a coil wound around the bobbin, and the bobbin may contact (or directly contact) the rear surface of the display device 200 through the first hole 310 of the first cover 300.

According to an embodiment of the present disclosure, the first vibration device 410 may be disposed at a first rear region of the first cover 300 and may vibrate a first region of the display device 200. For example, the first rear region of the first cover 300 may overlap a center portion CP or a periphery portion EP of the display device 200, and the first region of the display device 200 may be the center portion CP or the periphery portion EP.

The first vibration device 410 according to an embodiment of the present disclosure may be disposed at the middle region MA of the first cover 300 and may vibrate the center portion CP of the display device 200, thereby generating a first sound S1 of a first pitched sound band at the center portion CP of the display device 200. The first sound S1 of the first pitched sound band according to an embodiment of the present disclosure may have a frequency of a low-pitched sound band. For example, the low-pitched sound band may be 200 Hz or less, but embodiments of the present disclosure are not limited thereto and may be 3 kHz or less.

With reference to FIGS. 2 and 3, the first vibration device 410 according to an embodiment of the present disclosure may be disposed at (or coupled to or connected to) a middle region MA of the first cover portion 300a of the first cover 300. For example, the first vibration device 410 may be disposed at (or coupled to or connected to) a first supporting region SA1 in the middle region MA of the first cover portion 300a.

According to an embodiment of the present disclosure, the first vibration device 410 may be disposed at the rear surface of the first cover 300 by a sixth connection member 450. For example, the sixth connection member 450 may be disposed between the first cover portion 300a near the first hole 310 and a periphery portion 401 of the first vibration device 410 overlapping the first cover portion 300a and may connect (or fix) the first vibration device 410 to the rear surface of the first cover 300. For example, the sixth connection member 450 may include a double-sided tape or a double-sided foam including an adhesive layer. For example, the adhesive layer of the sixth connection member 450 may include a silicone-based adhesive material, an acrylic-based adhesive material, or an urethane-based adhesive material. For example, the adhesive layer of the sixth connection member 450 may include a silicone-based or urethane-based adhesive material which relatively has a ductile characteristic compared to an acrylic-based adhesive material having a characteristic where hardness is relatively high, so as to minimize the transfer of a vibration of the first vibration device 410 to the first cover portion 300a, but embodiments of the present disclosure are not limited thereto.

The first vibration device 410 according to an embodiment of the present disclosure may include a 1-1st vibration device 411 and a 1-$2^{nd}$ vibration device 413, but embodiments of the present disclosure are not limited thereto.

The 1-$1^{st}$ vibration device 411 may vibrate a first center portion CP1 of the center portion CP of the display device 200 based on a first driving signal to output a first sound S1 of the first pitched sound band in a forward direction FD of the display device 200. The 1-1st vibration device 411 may be disposed at a first supporting region SA1 in a first middle region MA1 of the middle region MA of the first cover portion 300a. For example, the 1-$1^{st}$ vibration device 411 may be disposed at (or coupled to or connected to) the first hole 310 which is formed at the first supporting region SA1 of the first middle region MA1 of the first cover portion 300a.

According to an embodiment of the present disclosure, when the 1-$1^{st}$ vibration device 411 vibrates based on the first driving signal, the backlight 230 may vibrate based on the vibration of the 1-$1^{st}$ vibration device 411, a sound pressure level may be generated in the sound transfer space STS based on the vibration of the backlight 230, and the first sound S1 of the first pitched sound band generated by a vibration of the first center portion CP1 of the display panel 210 based on the sound pressure level generated in the sound transfer space STS may be output in the forward direction FD of the display panel 210. Accordingly, a sound wave generated based on vibration of the 1-$1^{st}$ vibration device 411 may be directly transferred to the display device 200, and thus, a sound pressure level characteristic and sound quality of the first sound S1 may be enhanced.

The 1-$2^{nd}$ vibration device 413 may vibrate a second center portion CP2 of the center portion CP of the display device 200 based on a second driving signal to output the first sound S1 of the first pitched sound band in the forward direction FD of the display device 200. The 1-$2^{nd}$ vibration device 413 may be disposed at a first supporting region SA1 in a second middle region MA2 of the middle region MA of the first cover portion 300a. For example, the 1-$2^{nd}$ vibration device 413 may be disposed at (or coupled to or connected to) the first hole 310 which is formed at the first supporting region SA1 of the second middle region MA2 of the first cover portion 300a.

According to an embodiment of the present disclosure, when the 1-$2^{nd}$ vibration device 413 vibrates based on the second driving signal, the backlight 230 may vibrate based on the vibration of the 1-$2^{nd}$ vibration device 413, a sound pressure level may be generated in the sound transfer space STS based on the vibration of the backlight 230, and the first sound S1 of the first pitched sound band generated based on a vibration of the second center portion CP2 of the display panel 210 based on the sound pressure level generated in the sound transfer space STS may be output in the forward direction FD of the display panel 210. Accordingly, a sound wave generated based on vibration of the 1-$2^{nd}$ vibration device 413 may be directly transferred to the display device 200, and thus, a sound pressure level characteristic and sound quality of the first sound S1 may be enhanced.

According to an embodiment of the present disclosure, the first driving signal may be the same as or differ from the second driving signal. For example, the first driving signal may include a left middle sound signal or a first haptic feedback signal corresponding to the first center portion CP1 of the display device 200. For example, the second driving signal may include a right middle sound signal or a second haptic feedback signal corresponding to the second center portion CP2 of the display device 200.

Therefore, the display apparatus according to an embodiment of the present disclosure may use the display device 200 as a vibration plate configured to generate a sound, and thus, may output a sound in the forward direction of the display device 200, thereby improving sound quality and increasing the immersion experience of a viewer or a user.

With reference to FIGS. 2 and 3, the second vibration device 430 may be supported by the display device 200 and may vibrate the display device 200. For example, the second vibration device 430 may vibrate based on a driving signal including a sound signal or a haptic feedback signal to vibrate (or directly vibrate) the display device 200, and thus, may generate a second sound S2 based on a vibration of the display device 200 or generate a haptic feedback (or a haptic vibration) responding to a user touch.

According to an embodiment of the present disclosure, the second vibration device 430 may be disposed at the periphery portion EP of the display device 200 to correspond to a second hole 320 which is formed at the periphery region EA of the first cover portion 300a of the first cover 300. For example, the second vibration device 430 may include a piezoelectric material or a piezoelectric element having a piezoelectric effect (or an inverse piezoelectric characteristic). As another example, the second vibration device 430 may include a plurality of first portions and a plurality of second portions between the plurality of first portions. The first portion may be an inorganic material, and the second portion may be an organic material. The first portion and the second portion may be formed at a structure connected to each other on a plane, and thus, the second vibration device 430 may be implemented as one film. Based on such a configuration, comparing with a structure where a plurality of piezoelectric elements are stacked, the second vibration device 430 may be implemented as one film, and thus, a vibration apparatus having a thin thickness may be implemented. Accordingly, an increase in thickness of a display apparatus caused by the arrangement of a vibration apparatus may be reduced.

Each of the plurality of first portions according to an embodiment of the present disclosure may include an inorganic material or a piezoelectric material, each of which vibrating based on a piezoelectric effect (or a piezoelectric characteristic) caused by an electric field. For example, each of the plurality of first portions may be referred to as an electroactive portion, an inorganic material portion, a piezoelectric material portion, or a vibration portion, but embodiments of the present disclosure are not limited thereto.

According to an embodiment of the present disclosure, each of the plurality of first portions may include a ceramic-based material configured to generate a relatively high vibration, or may include a piezoelectric ceramic having a perovskite-based crystalline structure. The perovskite crystalline structure may have a piezoelectric effect and an inverse piezoelectric effect, and may be a plate-shaped structure having orientation. The perovskite crystalline structure may be represented by a chemical formula "$ABO_3$". In the chemical formula, "A" may include a divalent metal element, and "B" may include a tetravalent metal element. For example, in the chemical formula "$ABO_3$", "A", and "B" may be cations, and "0" may be anions. For example, the chemical formula "$ABO_3$" may include one of lead (II) titanate ($PbTiO_3$), lead zirconate ($PbZrO_3$), barium titanate ($BaTiO_3$), and strontium titanate ($SrTiO_3$), but embodiments of the present disclosure are not limited thereto.

When the perovskite crystalline structure includes a center ion (for example, $PbTiO_3$, e.g., lead (II) titanate, lead titanium oxide, or lead titanate with a perovskite structure), a position of a titanium (Ti) ion may be changed by an external stress or a magnetic field. Thus, polarization may be changed, thereby generating a piezoelectric effect. For example, in the perovskite crystalline structure, a cubic shape corresponding to a symmetric structure may be changed to a tetragonal (or quadrilateral), orthorhombic, or rhombohedral structure corresponding to an unsymmetric structure. Thus, a piezoelectric effect may be generated. In a tetragonal, orthorhombic, or rhombohedral structure corresponding to an unsymmetric structure, polarization may be high in a morphotropic phase boundary, and realignment of polarization may be easy, whereby the perovskite crystalline structure may have a high piezoelectric characteristic.

As an example, the inorganic material portion configured in each of the plurality of first portions may include a material, including one or more of lead (Pb), zirconium (Zr), titanium (Ti), zinc (Zn), nickel (Ni), and niobium (Nb), but embodiments of the present disclosure are not limited thereto. As another example, the inorganic material portion provided in each of the plurality of first portions may include a lead zirconate titanate (PZT)-based material, including lead (Pb), zirconium (Zr), and titanium (Ti); or may include a lead zirconate nickel niobate (PZNN)-based material, including lead (Pb), zirconium (Zr), nickel (Ni), and niobium (Nb), but embodiments of the present disclosure are not limited thereto. Also, the inorganic material portion may include at least one of calcium titanate ($CaTiO_3$), $BaTiO_3$, and $SrTiO_3$, each without Pb, but embodiments of the present disclosure are not limited thereto.

The plurality of second portions according to an embodiment of the present disclosure may have modulus and viscoelasticity that are lower than those of the first portion, and thus, the second portion may enhance the reliability of the first portion vulnerable to an impact due to a fragile characteristic. For the second vibration device 430 to have an impact resistance and high stiffness, each of the plurality of second portions may include a material having a relatively high damping factor (tan S) and relatively high stiffness. For example, each of the plurality of second portions may include a material having a damping factor (tan S) of about 0.1 [GPa] to about 1 [GPa] and relatively high stiffness of about 0 [GPa] to about 10 [GPa]. Also, a damping factor (tan S) and a stiff characteristic may be described based on a correlation between a loss coefficient and modulus. For example, the plurality of second portions may include a material having a loss coefficient of about 0.01 to about 1.0 and modulus of about 0.1 [GPa] to about 10 [GPa].

The organic material portion in each of the plurality of second portions may include an organic material or an organic polymer that each has a flexible characteristic in comparison with the inorganic material portion of each of the first portions. For example, each of the plurality of second portions may include one or more of an organic material, an organic polymer, an organic piezoelectric material, or an organic non-piezoelectric material. For example, each of the plurality of second portions may be referred to as an adhesive portion, an elastic portion, a bending portion, a damping portion, or a flexible portion having flexibility, but embodiments of the present disclosure are not limited thereto.

An organic material portion according to an embodiment of the present disclosure may include at least one of an organic piezoelectric material and an organic non-piezoelectric material.

An organic material portion including an organic piezoelectric material may absorb an impact applied to an inorganic material portion (or a first portion), and thus, the organic material portion may enhance the total durability of the second vibration device 430, and may provide a piezoelectric characteristic corresponding to a certain level or more. The organic piezoelectric material according to an embodiment of the present disclosure may be an organic material having an electro active characteristic. An organic material portion including an organic non-piezoelectric material may be configured to include a curable resin composition and an adhesive including the curable resin composition, and thus, the organic material portion may absorb an impact applied to an inorganic material portion (or a first portion), thereby enhancing the total durability of the second vibration device 430. The organic non-piezoelectric material according to an embodiment of the present disclosure may include at least one or more among an epoxy-based polymer, an acrylic-based polymer, and a silicone-based polymer, but embodiments of the present disclosure are not limited thereto.

As an example, an organic material including an organic non-piezoelectric material may include an adhesion promoter or an adhesion enhancing agent for adhesiveness between epoxy resin and an inorganic material portion, for a high stiffness characteristic for the second vibration device 430. For example, the adhesion promoter may be phosphate or the like, but embodiments of the present disclosure are not limited thereto. The organic material may be cured by at least one curing process of a thermal curing process and a photo-curing process. In a process of curing the organic material portion, solvent free type epoxy resin may be used for avoiding or preventing the thickness uniformity of the second vibration device 430 from being reduced by contraction of the organic material portion caused by volatilization of a solvent.

The organic material including the organic non-piezoelectric material may further include a reinforcing agent, e.g., for a damping characteristic in addition to high stiffness of the second vibration device 430. For example, the reinforcing agent may be methylmethacrylate-butadiene-styrene (NBS) having a core shell type, and a content thereof may be about 5 wt % to about 40 wt %. The reinforcing agent may be an elastic body having the core cell type, and may have a high coupling force to epoxy resin, such as an acrylic-based polymer. Thus, the reinforcing agent may enhance an impact resistance or a damping characteristic of the second vibration device 430.

According to an embodiment of the present disclosure, the plurality of first portions and the plurality of second portions may have the same size (or a width) or different sizes (or widths) from each other, may be alternately and repeatedly disposed along a first direction X (or a second direction Y), and may include a line shape or a stripe shape. For example, the plurality of first portions may be spaced apart from one another along the first direction X and the second direction Y. The plurality of second portions may be configured to fill a gap between two adjacent first portions or to surround each of the plurality of first portions. For example, each of the plurality of first portions may have the same size, may be disposed in a lattice shape, and may have a planar structure such as a circular shape, an oval shape, a polygonal shape, a donut shape, or the like.

According to an embodiment of the present disclosure, the second vibration device 430 may be disposed at a rear surface of the periphery portion EP of the display device 200 and may vibrate the periphery portion EP of the display device 200. The second vibration device 430 may be disposed at a rear surface of the periphery portion EP of the display device 200 and may vibrate the periphery portion EP of the display device 200. The second vibration device 430 may generate a second sound S2 of a second pitched sound band in the periphery portion EP of the display device 200. The second sound S2 of the second pitched sound band may be different from a first sound S1 of a first pitched sound band generated in the center portion CP of the display device 200. The second sound S2 of the second pitched sound band according to an embodiment of the present disclosure may have a frequency of a middle-high-pitched sound band or a high-pitched sound band. For example, the middle-pitched sound band may be 200 Hz to 3 kHz, but embodiments of the present disclosure are not limited thereto. For example, a high-pitched sound band may be 3 kHz or more, but embodiments of the present disclosure are not limited thereto, may be 5 kHz or more.

According to an embodiment of the present disclosure, the second vibration device 430 may be disposed at a rear surface of the display device 200 by a seventh connection member 470. For example, the second vibration device 430 may be disposed between the rear surface of the display device 200 corresponding to the second hole 320 and the second vibration device 430, and may connect (or fix) the second vibration device 430 to the rear surface of the display device 200.

According to an embodiment of the present disclosure, the seventh connection member 470 may include a double-sided tape or a double-sided foam pad including an adhesive layer. For example, the adhesive layer of the seventh connection member 470 according to an embodiment of the present disclosure may include an adhesive material of a silicone-based material, an acrylic-based polymer material, or urethane-based material. For example, the adhesive layer of the seventh connection member 470 may include an acrylic-based material which is relatively better in adhesive force and hardness so that a vibration of the second vibration device 430 may be transmitted to the display panel 210 well. The seventh connection member 470 may include a double-sided foam adhesive pad having the adhesive layer of the acrylic-based material, or an adhesive resin cured layer of an acrylic-based material.

The second vibration device 430 according to an embodiment of the present disclosure may include a 2-1st vibration device 431 and a 2-$2^{nd}$ vibration device 433, but embodiments of the present disclosure are not limited thereto.

The 2-1st vibration device 431 may vibrate (or directly vibrate) a first periphery portion EP1 (or a left periphery portion) of the periphery portion EP of the display device 200 based on a third driving signal including a sound signal or a haptic feedback signal to generate a second sound S2 based on the vibration of the display device 200 or to generate a haptic feedback (or a haptic vibration) responding to a user touch.

According to an embodiment of the present disclosure, the 2-$1^{st}$ vibration device 431 may vibrate the first periphery portion EP1 of the periphery portion EP of the display device 200 based on the third driving signal to output a second sound S2 of a second pitched sound band in the forward direction FD of the display panel 210. For example, the 2-$1^{st}$ vibration device 431 may be disposed at (or coupled to or connected to) the first periphery portion EP1 of the display device 200 to correspond to a second hole 320 which is formed at a second supporting region SA2 in a first periphery region (or a left periphery region) EA1 of the periphery region EA of the first cover portion 300a.

According to an embodiment of the present disclosure, when the 2-$1^{st}$ vibration device 431 vibrates based on the third driving signal, the backlight 230 may vibrate based on the vibration of the 2-$1^{st}$ vibration device 431, a sound pressure level may be generated in the sound transfer space STS based on the vibration of the backlight 230, and the second sound S2 of the second pitched sound band generated by a vibration of the first periphery portion EP1 of the display panel 210 based on the sound pressure level generated in the sound transfer space STS may be output in the forward direction FD of the display panel 210. Accordingly, a sound wave generated based on vibration of the 2-1st vibration device 431 may be directly transferred to the display device 200, and thus, a sound pressure level characteristic and sound quality of the second sound S2 may be enhanced.

The 2-$2^{nd}$ vibration device 433 may vibrate (or directly vibrate) a second periphery portion EP2 (or a right periphery portion) of the periphery portion EP of the display device 200 based on a fourth driving signal including a sound signal or a haptic feedback signal to generate the second sound S2 based on the vibration of the display device 200 or to generate a haptic feedback (or a haptic vibration) responding to a user touch.

According to an embodiment of the present disclosure, the 2-$2^{nd}$ vibration device 433 may vibrate the second periphery portion EP2 of the periphery portion EP of the display device 200 based on the fourth driving signal to output the second sound S2 of the second pitched sound band in the forward direction FD of the display panel 210. For example, the 2-$2^{nd}$ a vibration device 433 may be disposed at (or coupled to or connected to) the second periphery portion EP2 of the display device 200 to correspond to a second hole 320 which is formed at a second supporting region SA2 in a second periphery region (or a right periphery region) EA2 of the periphery region EA of the first cover portion 300a.

According to an embodiment of the present disclosure, when the 2-$2^{nd}$ a vibration device 433 vibrates based on the fourth driving signal, the backlight 230 may vibrate based on the vibration of the 2-$2^{nd}$ vibration device 433, a sound pressure level may be generated in the sound transfer space STS based on the vibration of the backlight 230, and the second sound S2 of the second pitched sound band generated by a vibration of the second periphery portion EP2 of the display panel 210 based on the sound pressure level generated in the sound transfer space STS may be output in the forward direction FD of the display panel 210. Accordingly, a sound wave generated based on vibration of the 2-2$^{nd}$ vibration device 433 may be directly transferred to the display device 200, and thus, a sound pressure level characteristic and sound quality of the second sound S2 may be enhanced.

According to an embodiment of the present disclosure, the third driving signal may be the same as or differ from the fourth driving signal. For example, the third driving signal may include a left periphery sound signal or a third haptic feedback signal corresponding to the first periphery portion EP1 of the display device 200. The fourth driving signal may include a right periphery sound signal or a fourth haptic feedback signal corresponding to the second periphery portion EP2 of the display device 200.

With reference to FIGS. 5 and 6, the second cover 500 may be supported by the front member 100 and may cover and protect the driving circuit part 220. For example, the second cover 500 may cover the flexible circuit film 221 and the PCB 223 of the driving circuit part 220. For example, one side of the second cover 500 may be disposed at (or fixed to or connected to) a rear surface of the front member 100, and the other side of the second cover 500 may be disposed at (or fixed to or connected to) the PCB 223. For example, the second cover 500 may be disposed at the PCB 233 by an adhesive member such as a double-sided foam tape or a double-sided tape including an adhesive layer. For example, in order to prevent the second cover 500 from contacting the control circuit 224 disposed at the PCB 223, the adhesive member may have a thickness which is greater than a height of the control circuit 224.

According to an embodiment of the present disclosure, the other side of the second cover 500 may be disposed at (or fixed to or connected to) the connector 225 disposed at the PCB 223. For example, the other side of the second cover 500 may be disposed at a rear surface of the connector 225. For example, the other side of the second cover 500 may be disposed at the connector 225 by a second coupling member 700 (or a cover fixing member, or a cover connection member). For example, the second coupling member 700 may be disposed between the rear surface of the PCB 223 and the second cover 500 and may connect or fix the PCB 223 to the second cover 500. For example, the second coupling member 700 may include a double-sided tape or a double-sided foam including an adhesive layer. The adhesive layer of the second coupling member 700 may include a silicone-based adhesive material, an acrylic-based adhesive material, or an urethane-based adhesive material. For example, the adhesive layer of the second coupling member 700 may include a silicone-based or urethane-based adhesive material which relatively has a ductile characteristic compared to an acrylic-based adhesive material having a characteristic where hardness is relatively high, so as to minimize the transfer of the shaking of the PCB 223, caused by a vibration of the vibration apparatus 400, to the second cover 500, but embodiments of the present disclosure are not limited thereto.

According to an embodiment of the present disclosure, the second cover 500 may include a first shield region (or a first cover region, or a first cover region) 500a and a second shield region (or a second cover region, or a second cover region) 500b, but a configuration of the second cover 500 is not limited thereto.

According to an embodiment of the present disclosure, the first shield region 500a may be disposed at the rear surface of the front member 100 and may be supported by the front member 100. For example, the first shield region 500a may be disposed to cover the flexible circuit film 221 of the driving circuit part 220 and to face the side part 240b of the panel guide 240. Accordingly, the flexible circuit film 221 may be disposed between the first shield region 500a of the second cover 500 and the side part 240b of the panel guide 240 and may be covered and protected by the first shield region 500a of the second cover 500.

According to an embodiment of the present disclosure, the second shield region 500b may extend from the first shield region 500a to the rear surface of the first cover 300. For example, the second shield region 500b may cover the flexible circuit film 221 and the PCB 223 disposed at the rear surface of the first cover 300. For example, an extending end or one side of the second shield region 500b may be fixed to (or connected to) the PCB 223. For example, the extending end or one side of the second shield region 500b may be disposed at (or fixed to or connected to) the connector 225 disposed at the PCB 223. For example, the extending end or one side of the second shield region 500b may be disposed at a rear surface of the connector 225 by the second coupling member 700.

Figure 10:
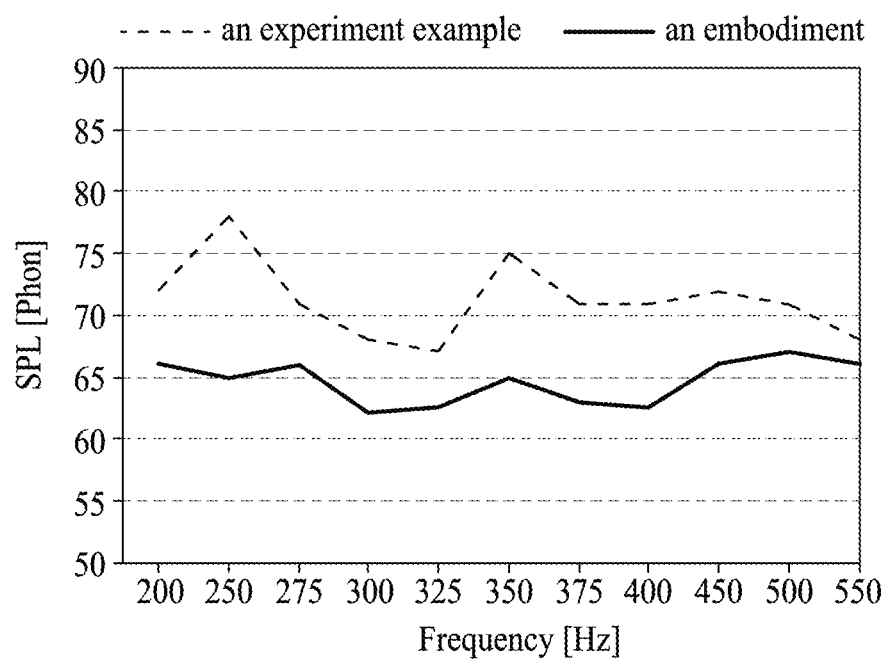
FIG. 10 illustrates a result obtained by measuring a frictional sound between a first cover and a printed circuit board before and after a first coupling member is disposed between the first cover and the printed circuit board.

FIG. 10 is a graph showing a result obtained by measuring a frictional sound between a first cover and a PCB before and after a first coupling member is disposed between the first cover and the PCB.

In FIG. 10, the abscissa axis represents a frequency (Hz), and the ordinate axis represents a sound pressure level (SPL) (dB). In FIG. 10, an experiment example (a dot line) illustrates a result obtained by measuring a frictional sound between the first cover 300 and the PCB 223 in a state where the first coupling member 600 is not disposed between the first cover 300 and the PCB 223, and an embodiment of the present disclosure (a solid line) illustrates a result obtained by measuring a frictional sound between the first cover 300 and the PCB 223 in a state where the first coupling member 600 is disposed between the first cover 300 and the PCB 223 as in FIG. 9.

As seen in FIG. 10, it may be seen that frictional noise, measured in a case (an embodiment of the present disclosure) where the first coupling member 600 is disposed between the first cover 300 and the PCB 223, is lower than frictional noise measured in a case (the experiment example) where the first coupling member 600 is not disposed between the first cover 300 and the PCB 223, within a measurement frequency range. Accordingly, in a display apparatus according to an embodiment of the present disclosure, when the first coupling member 600 is disposed between the first cover 300 and the PCB 223, noise between the first cover 300 and the PCB 223 may be reduced.

Figure 11:
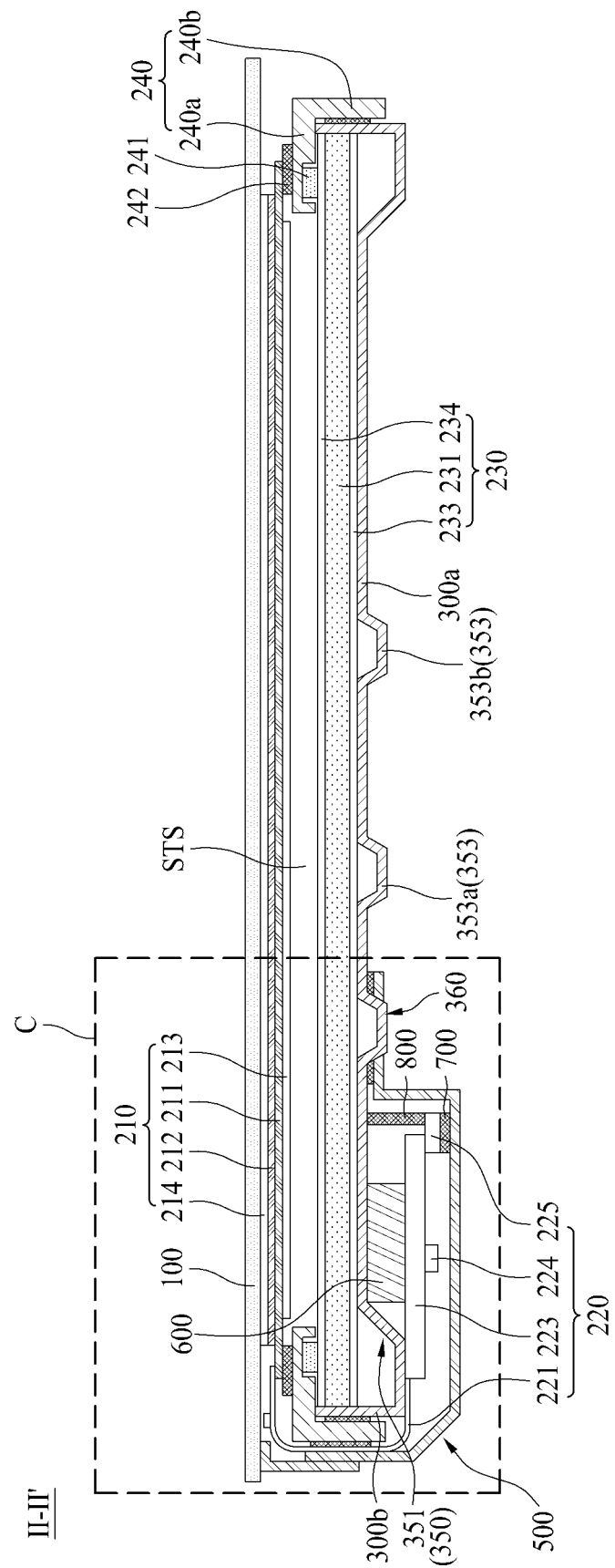
FIG. 11 is a cross-sectional view taken along line II-II' of FIG. 2 illustrating a display apparatus according to another embodiment of the present disclosure.
Figure 12:
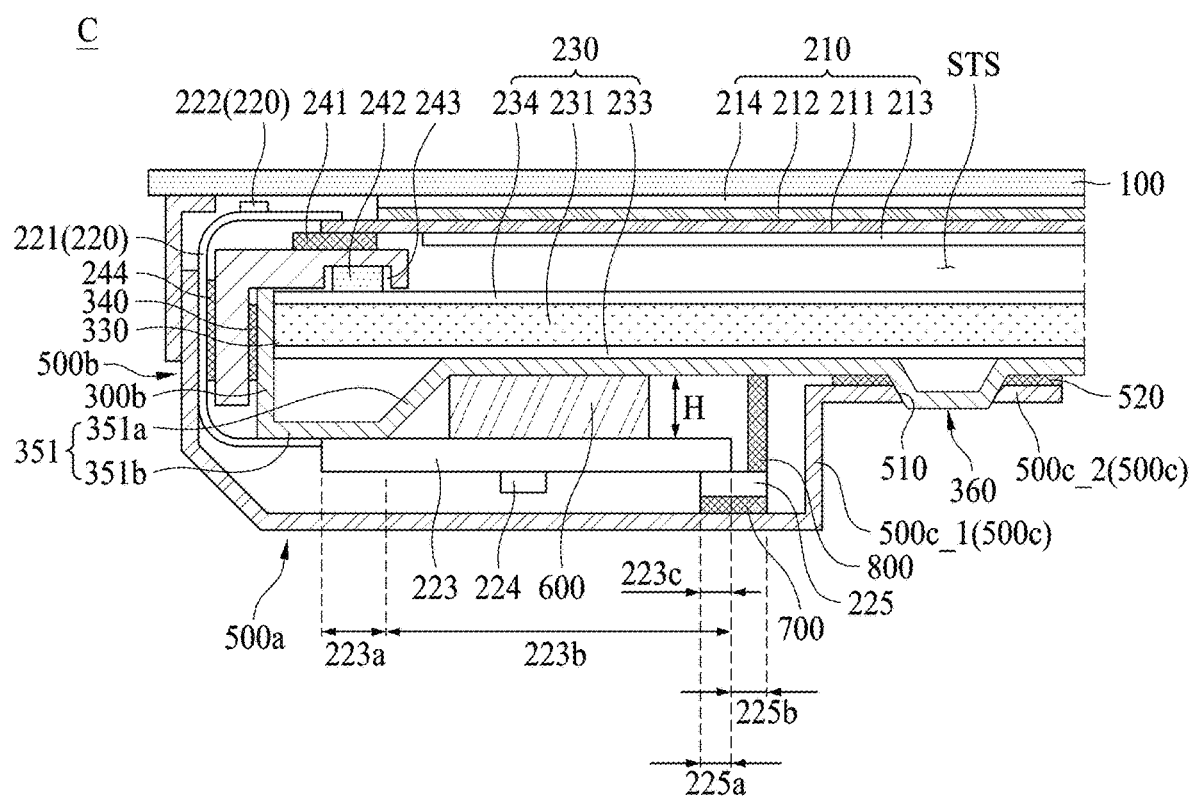
FIG. 12 is an enlarged view of a region 'C' illustrated in FIG. 11.

FIG. 11 is a cross-sectional view taken along line II-II' of FIG. 2 illustrating a display apparatus according to another embodiment of the present disclosure. FIG. 12 is an enlarged view of a region 'C' illustrated in FIG. 11.

The display apparatus according to another embodiment of the present disclosure may be implemented by modifying a fixing structure of the second cover 500 in the display apparatus illustrated in FIGS. 1 to 9. In the following description, repeated descriptions of the same elements other than a modified element and elements relevant thereto will be briefly given or are omitted.

With reference to FIGS. 11 and 12, in the display apparatus according to another embodiment of the present disclosure, the first cover 300 may further include a first connection portion 360 for coupling (or fixing) between the first cover 300 and a second cover 500. For example, the first connection portion 360 may be provided at a first cover portion 300a of the first cover 300. For example, the first connection portion 360 may be a protrusion portion which protrudes to a rear surface of the first cover portion 300a. For example, the first connection portion 360 may be provided at the first cover portion 300a of the first cover 300 so as to be adjacent to a periphery of a PCB 223. For example, the first connection portion 360 may be provided to be adjacent to a third coupling member 800. The positions, shapes, and number of the first connection portion 360 may be variously modified to correspond to the first cover 500 and the second connection portion 510.

In the display apparatus according to another embodiment of the present disclosure, the second cover 500 may further include a second connection portion 510 for coupling (or fixing) between the first connection portion 360 of the second cover 300 and the second cover 500. In this manner, when the display apparatus includes the first connection portion 360 and the second connection portion 510, the second coupling member 700 may be omitted.

According to an embodiment of the present disclosure, the second cover 500 may include a third shield region 500c which extends toward a center portion of the first cover 300 from an end or one side of a second shield region 500b covering the PCB 223, and the second connection portion 510 may be provided in the third shield region 500c. For example, the second connection portion 510 may be a hole and may have a structure into which the first connection portion 360 is inserted or accommodated.

According to an embodiment of the present disclosure, the third shield region (or a third cover region) 500c may include a first extension portion 500c_1 and a second extension portion 500c_2, but embodiments of the present disclosure are not limited thereto.

The first extension portion 500c_1 may be disposed to be vertical toward the first cover portion 300a or to have a slope toward a center portion of the first cover portion 300a, from the extending end or one side of the second shield region 500b.

The second extension portion 500c_2 may extend from the first extension portion 500c_1 and may be disposed at a rear surface of the first cover portion 300a. For example, the second extension portion 500c_2 may extend from the first extension portion 500c_1 so as to be horizontal to the first cover portion 300a. For example, the second connection portion 510 may be provided at the second extension portion 500c_2.

According to an embodiment of the present disclosure, an eighth connection member 520 may be disposed between the third shield region 500c of the second cover 500 and the first cover portion 300a of the first cover 300 and may increase a coupling force between the third shield region 500c and the first cover portion 300a. For example, the eighth connection member 520 may be disposed to be adjacent to the first connection portion 360 and the second connection portion 510 and may increase a coupling force between the first connection portion 360 and the second connection portion 510. For example, the eighth connection member 520 may include a double-sided tape or a double-sided foam including an adhesive resin (or an adhesive layer), but embodiments of the present disclosure are not limited thereto. For example, the adhesive resin (or the adhesive layer) of the eighth connection member 520 may include a silicone-based adhesive material, an acrylic-based adhesive material, or an urethane-based adhesive material, but embodiments of the present disclosure are not limited thereto. For example, the adhesive resin (or the adhesive layer) of the eighth connection member 520 may include a silicone-based or urethane-based adhesive material which relatively has a ductile characteristic compared to an acrylic-based adhesive material having a characteristic where hardness is relatively high, so as to prevent or minimize the transfer of a vibration of the first cover 300 to the PCB 223, but embodiments of the present disclosure are not limited thereto.

The display apparatus according to an embodiment of the present disclosure may be applied to various electronic apparatus. The display apparatus (or the apparatus) according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic book, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, etc. Also, the vibration apparatus according to an embodiment of the present disclosure may be applied to organic light emitting lighting apparatuses or inorganic light emitting lighting apparatuses. When the vibration apparatus of an embodiment of the present disclosure is applied to lighting apparatuses, the vibration apparatus may act as lighting and a speaker. Also, when the vibration apparatus of an embodiment of the present disclosure is applied to a mobile device, the vibration apparatus may act as one or more of a speaker, a receiver, and a haptic, but embodiments of the present disclosure are not limited thereto.

A display apparatus according to an embodiment of the present disclosure will be described below.

A display apparatus according to some embodiments of the present disclosure may comprise a display device including a display panel configured to display an image and a driving circuit part including a printed circuit board connected to the display panel, a first cover disposed at a rear surface of the display device, a first coupling member disposed between the first cover and the printed circuit board, and a vibration apparatus disposed at the rear surface of the display device and configured to vibrate the display device, the printed circuit board is disposed at one periphery of a rear surface of the first cover.

According to some embodiments of the present disclosure, the driving circuit part may be configured to extend from a periphery of the display panel along a side surface and a rear surface of the first cover and to be fixed to or connected to the rear surface of the first cover.

According to some embodiments of the present disclosure, the first coupling member may include a plurality of coupling members spaced apart from one another by a certain interval and may be disposed at the first cover.

According to some embodiments of the present disclosure, the adhesive layer of the first coupling member may include a silicone-based or urethane-based adhesive material.

According to some embodiments of the present disclosure, the first cover may comprise a first cover portion disposed at the rear surface of the display device, a reinforcement portion disposed at a periphery of the first cover portion and configured to protrude in a rearward direction of the first cover, and a second cover portion bent from one side of the reinforcement portion to a front surface of the display apparatus, and the printed circuit board is disposed at a rear surface of the reinforcement portion.

According to some embodiments of the present disclosure, the first cover may further comprise one or more second reinforcement portions formed at a middle region of the first cover portion.

According to some embodiments of the present disclosure, the first coupling member may be disposed between the printed circuit board and the rear surface of the first cover adjacent to the reinforcement portion.

According to some embodiments of the present disclosure, the first coupling member may have a thickness which is greater than or may be equal to a height difference between the reinforcement portion and the first cover.

According to some embodiments of the present disclosure, the reinforcement portion may comprise an inclined surface disposed to be inclined in a direction from a periphery of the first cover to the rear surface of the first cover, and a flat surface disposed to be horizontal from one side of the inclined surface to the second cover portion, and the printed circuit board may be disposed at a rear surface of the flat surface.

According to some embodiments of the present disclosure, the first coupling member may have a thickness which is greater than or may be equal to a height difference between the flat surface and the first cover portion.

According to some embodiments of the present disclosure, the printed circuit board may comprises a first connection region overlapping the reinforcement portion, and a second connection region overlapping the first cover, and the first coupling member may be disposed between the first cover and the second connection region.

According to some embodiments of the present disclosure, the display apparatus may further comprise a front member disposed at a front surface of the display device, and a second cover supported by one periphery of a rear surface of the front member and configured to cover the printed circuit board.

According to some embodiments of the present disclosure, the second cover may be disposed at the printed circuit board by an adhesive member.

According to some embodiments of the present disclosure, the adhesive member may have a thickness which is greater than a height of a control circuit disposed at the printed circuit board.

According to some embodiments of the present disclosure, the second cover may comprise a first region supported by the rear surface of the front member and configured to cover a side surface of the display device and a side surface of the second cover, and a second region extending from the first region to a rear surface of the second cover and configured to cover the printed circuit board.

According to some embodiments of the present disclosure, the driving circuit part may further comprise a connector disposed at the printed circuit board, and the second cover may be disposed at the connector by a second coupling member.

According to some embodiments of the present disclosure, the connector may comprise a first connection region disposed at the printed circuit board, and a second connection region extending from the first connection region to be exposed to the first cover, and the second coupling member may be disposed between the second connection region and the second cover.

According to some embodiments of the present disclosure, the display apparatus may further comprise a third coupling member disposed between the second connection region and the first cover.

According to some embodiments of the present disclosure, the display device may comprise a backlight disposed at the rear surface of the display device, and a panel guide disposed between the display panel and the backlight, the driving circuit part may comprise a flexible circuit film connected between the display panel and the printed circuit board, and the flexible circuit film may be disposed along a region between the panel guide and the first cover.

According to some embodiments of the present disclosure, the display apparatus may further comprise at least one among a first connection member disposed between the display panel and the panel guide, a second connection member disposed between the panel guide and the backlight, and a third connection member disposed between the panel guide and the flexible circuit film.

According to some embodiments of the present disclosure, the panel guide may comprise a groove formed at a surface opposite to the backlight, and the second connection member may be accommodated into the groove.

According to some embodiments of the present disclosure, the panel guide may comprise a supporting part disposed between a periphery portion of the display panel and a periphery portion of the backlight, and a side part extending from the supporting portion and configured to cover a side surface of the backlight.

According to some embodiments of the present disclosure, the first cover may comprise a second cover portion disposed between the side surface of the backlight and the side part of the panel guide.

According to some embodiments of the present disclosure, the display apparatus may further comprise at least one among a fourth connection member disposed between the second cover portion of the first cover and the side surface of the backlight, and a fifth connection member disposed between the second cover portion of the first cover and the side part of the panel guide.

According to some embodiments of the present disclosure, the first cover may comprise a first rear region, a second rear region, a first hole disposed at the first rear region, and a second hole disposed at the second rear region, the vibration apparatus may comprise a first vibration device disposed at the rear surface of the display device and configured to overlap the first hole, and a second vibration device disposed at the rear surface of the display device and configured to overlap the second hole.

According to some embodiments of the present disclosure, the first vibration device may be disposed at a middle region of the first cover and may be configured to vibrate the center portion of the display panel to generate a first sound of a first pitched sound band. And the second vibration device may be disposed at a periphery portion of the first cover and may be configured to vibrate the periphery portion of the display panel to generate a second sound of a second pitched sound band.

According to some embodiments of the present disclosure, the first vibration device may be disposed at the first cover by a sixth connection member, and the second vibration device may be disposed at a rear surface of the first cover by a seventh connection member.

According to some embodiments of the present disclosure, the first vibration device may be a coil type vibration device, and the second vibration device may be a film type vibration device.

According to some embodiments of the present disclosure, the first cover may further comprise a first connection portion provided adjacent to a periphery of the printed circuit board, and the second cover may further comprise a second connection portion connected to the first connection portion.

According to some embodiments of the present disclosure, the first connection portion may be a protrusion portion protruding to the rear surface of the first cover, and the second connection portion may be a hole.

According to some embodiments of the present disclosure, the second cover may comprise a third region extending toward a center portion of the first cover from a region covering the printed circuit board, and the second connection portion may be provided at the third region.

According to some embodiments of the present disclosure, the display apparatus may further comprise an eighth connection member disposed between the third region of the second cover and the first cover.

According to some embodiments of the present disclosure, the eighth connection member may be disposed adjacent to the first connection portion and the second connection portion.

According to some embodiments of the present disclosure, the adhesive layer of the eighth connection member may include a silicone-based or urethane-based adhesive material.

It will be apparent to those skilled in the art that various modifications and variations can be made in the display apparatus of the present disclosure without departing from the technical idea or scope of the disclosures. Thus, it is intended that embodiments the present disclosure cover the modifications and variations of the disclosure provided they come within the scope of the appended claims and their equivalents.

What is claimed is:

1. A display apparatus, comprising:
   a display device including a display panel configured to display an image and a driving circuit part including a printed circuit board connected to the display panel;
   a first cover disposed at a rear surface of the display device;
   a second cover disposed at a rear surface of the first cover;
   at least one first coupling member disposed between the first cover and the second cover;
   a vibration apparatus disposed at the rear surface of the display device and configured to vibrate the display device; and
   at least one connection member disposed between the display panel and the first cover,
   wherein the printed circuit board is disposed at a periphery of a rear surface of the first cover,
   wherein the first cover comprises:
      a first cover portion disposed at the rear surface of the display device;
      a reinforcement portion disposed at a periphery of the first cover portion and configured to protrude in a rearward direction of the first cover; and
      a second cover portion bent from one side of the reinforcement portion to a front surface of the display apparatus, and
   wherein the printed circuit board is disposed at a rear surface of the reinforcement portion.

2. The display apparatus of claim 1, wherein the driving circuit part is configured to extend from a periphery of the display panel along a side surface and the rear surface of the first cover and to be fixed to or connected to the rear surface of the first cover.

3. The display apparatus of claim 1, wherein the at least one first coupling member includes a plurality of coupling members spaced apart from one another by a certain interval and disposed at the first cover.

4. The display apparatus of claim 1, wherein an adhesive layer of the at least one first coupling member includes a silicone-based or urethane-based adhesive material.

5. The display apparatus of claim 1, wherein the first cover further comprises one or more second reinforcement portions formed at a middle region of the first cover portion.

6. The display apparatus of claim 1, wherein the at least one first coupling member is disposed between the printed circuit board and a rear surface of the first cover portion adjacent to the reinforcement portion.

7. The display apparatus of claim 1, wherein the reinforcement portion comprises:
   an inclined surface disposed to be inclined in a direction from a periphery of the first cover to a rear surface of the first cover portion; and
   a flat surface disposed to be horizontal from one side of the inclined surface to the second cover portion, and
   wherein the printed circuit board is disposed at a rear surface of the flat surface.

8. The display apparatus of claim 7, wherein the at least one first coupling member has a thickness which is greater than or is equal to a height difference between the flat surface and the first cover portion.

9. The display apparatus of claim 7, wherein the printed circuit board comprises:
   a first connection region overlapping the reinforcement portion; and
   a second connection region overlapping the first cover portion, and
   wherein the at least one first coupling member is disposed between the first cover portion and the second connection region.

10. The display apparatus of claim 1, wherein the second cover is disposed at the printed circuit board by an adhesive member.

11. The display apparatus of claim 10, wherein the adhesive member has a thickness which is greater than a height of a control circuit disposed at the printed circuit board.

12. The display apparatus of claim 1, further comprising a front member disposed at a front surface of the display device,
   wherein the second cover is supported by a periphery of a rear surface of the front member and configured to cover the printed circuit board.

13. The display apparatus of claim 12, wherein the second cover comprises:
   a first region supported by the rear surface of the front member and configured to cover a side surface of the display device and a side surface of the first cover; and
   a second region extending from the first region to the rear surface of the first cover and configured to cover the printed circuit board.

14. The display apparatus of claim 1, wherein the driving circuit part further comprises a connector disposed at the printed circuit board, and
   wherein the second cover is disposed at the connector by a second coupling member.

15. The display apparatus of claim 14, wherein the connector comprises:

a first connection region disposed at the printed circuit board; and a second connection region extending from the first connection region to be exposed to the first cover, and wherein the second coupling member is disposed between the second connection region and the second cover.

16. The display apparatus of claim 15, further comprising a third coupling member disposed between the second connection region and the first cover.

17. The display apparatus of claim 1, wherein the display device comprises:

a backlight disposed at the rear surface of the display device; and a panel guide disposed between the display panel and the backlight, wherein the driving circuit part comprises a flexible circuit film connected between the display panel and the printed circuit board, and wherein the flexible circuit film is disposed along a region between the panel guide and the second cover.

18. The display apparatus of claim 17, further comprising at least one of:

a first connection member disposed between the display panel and the panel guide;

a second connection member disposed between the panel guide and the backlight; and a third connection member disposed between the panel guide and the flexible circuit film.

19. The display apparatus of claim 18, wherein the panel guide comprises a groove formed at a surface opposite to the backlight, and wherein the second connection member is accommodated into the groove.

20. The display apparatus of claim 17, wherein the panel guide comprises:

a supporting part disposed between a periphery portion of the display panel and a periphery portion of the backlight; and a side part extending from the supporting part and configured to cover a side surface of the backlight.

21. The display apparatus of claim 20, wherein the first cover comprises a second cover portion disposed between the side surface of the backlight and the side part of the panel guide.

22. The display apparatus of claim 21, further comprising at least one of:

a fourth connection member disposed between the second cover portion of the first cover and the side surface of the backlight; and a fifth connection member disposed between the second cover portion of the first cover and the side part of the panel guide.

23. The display apparatus of claim 1, wherein the rear surface of the first cover comprises a first rear region, a second rear region, a first hole disposed at the first rear region, and a second hole disposed at the second rear region, and wherein the vibration apparatus comprises:

a first vibration device disposed at the rear surface of the display device and configured to overlap the first hole; and a second vibration device disposed at the rear surface of the display device and configured to overlap the second hole.

24. The display apparatus of claim 23, wherein the first vibration device is disposed at a middle region of the first cover and configured to vibrate the center portion of the display panel to generate a first sound of a first pitched sound band, and wherein the second vibration device is disposed at a periphery portion of the first cover and configured to vibrate the periphery portion of the display panel to generate a second sound of a second pitched sound band.

25. The display apparatus of claim 23, wherein the first vibration device is disposed at the rear surface of the first cover by a sixth connection member, and wherein the second vibration device is disposed at the rear surface of the first cover by a seventh connection member.

26. The display apparatus of claim 23, wherein the first vibration device is a coil type vibration device, and the second vibration device is a film type vibration device.

27. The display apparatus of claim 1, wherein the first cover further comprises a first connection portion provided adjacent to a periphery of the printed circuit board, and wherein the second cover further comprises a second connection portion connected to the first connection portion.

28. The display apparatus of claim 27, wherein the first connection portion is a protrusion portion protruding to the rear surface of the first cover, and wherein the second connection portion is a hole.

29. The display apparatus of claim 27, wherein the second cover comprises a third region extending toward a center portion of the first cover from a region covering the printed circuit board, and wherein the second connection portion is provided at the third region.

30. The display apparatus of claim 29, further comprising an eighth connection member disposed between the third region of the second cover and the first cover.

31. The display apparatus of claim 30, wherein the eighth connection member is disposed adjacent to the first connection portion and the second connection portion.

32. The display apparatus of claim 30, wherein an adhesive layer of the eighth connection member includes a silicone-based or urethane-based adhesive material.

* * * * *